United States Patent
Dempsey et al.

(10) Patent No.: US 11,984,479 B2
(45) Date of Patent: May 14, 2024

(54) HYBRID FIELD-EFFECT TRANSISTOR

(71) Applicant: Analog Devices International Unlimited Company, Limerick (IE)

(72) Inventors: Dennis A. Dempsey, Newport (IE); Andrew Christopher Linehan, Limerick (IE); Seamus P. Whiston, Limerick (IE); David J. Rohan, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/177,556

(22) Filed: Feb. 17, 2021

(65) Prior Publication Data
US 2022/0262904 A1   Aug. 18, 2022

(51) Int. Cl.
| H01L 29/66 | (2006.01) |
| H01L 29/06 | (2006.01) |
| H01L 29/10 | (2006.01) |

(52) U.S. Cl.
CPC ...... H01L 29/1041 (2013.01); H01L 29/0649 (2013.01); H01L 29/66537 (2013.01)

(58) Field of Classification Search
CPC . H01L 21/762–76297; H01L 21/76213; H01L 21/76216; H01L 21/76368; H01L 29/42368; H01L 29/42376
See application file for complete search history.

(56) References Cited

U.S. PATENT DOCUMENTS

| 5,550,728 | A |   | 8/1996 | Ellis |
| 5,641,982 | A | * | 6/1997 | Takahashi ........... H01L 29/1083 257/652 |

(Continued)

FOREIGN PATENT DOCUMENTS

| CN | 101719511 B | 12/2012 |
| CN | 103579079 B | 10/2016 |
| FR | 2 981 503 A1 | 4/2013 |

OTHER PUBLICATIONS

Anelli et al., "Radiation tolerant VLSI circuits in standard deep submicron CMOS technologies for the LHC experiments: practical design aspects", IEEE Transactions on Nuclear Science, vol. 46, No. 6, Dec. 1999, pp. 1690-1696.

(Continued)

*Primary Examiner* — Eric A. Ward
(74) *Attorney, Agent, or Firm* — Knobbe, Martens, Olson & Bear, LLP

(57) ABSTRACT

The present disclosure relates to a field effect transistor (FET) structure. The FET structure has a substrate, an active region, a dielectric layer provided over a channel of the active region and a gate provided over the dielectric layer. The active region comprises a source, a drain and the channel provided between the source and the drain. The active region is surrounded by an isolation trench, such that width edges of the channel are directly adjacent to the isolation trench. Current paths run between the source and the drain, through the channel. The FET is configured such that current paths running proximal to the channel edges are reduced or weaker in comparison to a dominant current path running through a center of the channel. One or more of the channel, the dielectric layer or the substrate can be modified or adapted to provide the reduced and dominant current paths. In one example, the center of the channel away from the edges has a first doping concentration of a first conductivity type, and the sides of the channel along the channel edges have a second doping concentration of the first conductivity type, where the second doping concentration is greater than the first doping concentration. In another example, the dielectric layer is thicker over the sides of the channel and thinner over the center of the channel. In another example, regions of the substrate below the sides of the channel have a higher doping concentration than a region (Continued)

of the substrate below the center of the channel. In some examples, the FET structure has both the dielectric layer of different thicknesses and the different doping concentrations in the channel and/or the substrate.

21 Claims, 25 Drawing Sheets

(56) References Cited

U.S. PATENT DOCUMENTS

| | | | |
|---|---|---|---|
| 5,721,444 A | 2/1998 | Oashi et al. | |
| 5,841,170 A | 11/1998 | Adan et al. | |
| 6,096,612 A * | 8/2000 | Houston | H01L 29/42368 438/296 |
| 6,097,069 A * | 8/2000 | Brown | H01L 29/42368 257/411 |
| 6,144,047 A * | 11/2000 | Higuchi | H01L 21/76205 257/341 |
| 6,562,697 B1 * | 5/2003 | Cho | H01L 21/823481 438/296 |
| 6,780,686 B2 * | 8/2004 | Wei | H01L 29/66772 257/E21.415 |
| 7,755,162 B2 | 7/2010 | Kurjanowicz et al. | |
| 8,759,916 B2 | 6/2014 | Bryant et al. | |
| 8,933,492 B2 | 1/2015 | Kurjanowicz | |
| 10,115,787 B1 * | 10/2018 | Paul | H01L 29/0649 |
| 10,608,110 B2 | 3/2020 | Chatterjee | |
| 10,714,583 B2 | 7/2020 | Rivero et al. | |
| 2007/0257331 A1 | 11/2007 | Kurjanowicz et al. | |
| 2010/0038728 A1 | 2/2010 | Anderson et al. | |
| 2010/0044801 A1 | 2/2010 | Anderson et al. | |
| 2010/0213545 A1 | 8/2010 | Kho et al. | |
| 2011/0084324 A1 * | 4/2011 | Donnelly | H01L 21/76202 438/297 |
| 2013/0092987 A1 | 4/2013 | Lopez | |
| 2019/0296119 A1 | 9/2019 | Kasai | |

OTHER PUBLICATIONS

Chan et al., "STI-to-gate distance effects on flicker noise characteristics in 0.13 μm CMOS", Solid-State Electronics 52 (2008) 1182-1187.
Chen et al., "Study of n-channel MOSFETs with an enclosed-gate layout in a 0.18 micron CMOS technology", IEEE Symposium Conference Record Nuclear Science 2004, Oct. 16-22, 2004.
Dempsey, D., "Mos Layout Variations—STI impact on 1/f", Analog Devices, Jan. 7, 2019 Rev 3.0.
Dempsey, D., "Low Frequency Noise SIG MOSFET "Hump Effect" vs RTN vs RBD & SER—Simple Many Layout styles", Jun. 11, 2020.
Faccio et al., "Radiation-Induced Edge Effects in Deep Submicron CMOS Transistors", IEEE Transactions on Nuclear Science, vol. 52, No. 6, Dec. 2005, pp. 2413-2420.
Hatano et al., "Radiation-Tolerant High-Performance CMOS VLSI Circuit Design", IEEE Transactions on Nuclear Science, vol. 32, No. 6, Dec. 1985, pp. 4031-4035.
Hatano et al., "Total Dose Radiation-Hardened Latch-Up Free CMOS Structures for Radiation-Tolerant VLSI Designs", IEEE Transactions on Nuclear Science, vol. 33, No. 6, Dec. 1986, pp. 1505-1509.
Joly et al., "Impact of hump effect on MOSFET mismatch in the sub-threshold area for low power analog applications", 2010 10th IEEE International Conference on Solid-State and Integrated Circuit Technology, Nov. 1-4, 2010.
Joly et al., "Octagonal MOSFET: Reliable device for low power analog applications", 2011 Proceedings of the European Solid-State Device Research Conference (ESSDERC), IEEE, Sep. 12-16, 2011.
Joly et al., "Temperature and hump effect impact on output voltage spread of low power bandgap designed in the sub-threshold area", 2011 IEEE International Symposium of Circuits and Systems (ISCAS), May 15-18, 2011.
Ker et al., "Novel octagonal device structure for output transistors in deep-submicron low-voltage CMOS technology", International Electron Devices Meeting. Technical Digest, IEEE, Dec. 8-11, 1996.
Lopez et al., Improved Analytical I-V model for polygonal-shape enclosed layout transistors, 2007 18th European Conference on Circuit Theory and Design, IEEE, Aug. 27-30, 2007.
Lopez et al., "Performance analysis of high-speed MOS transistors with different layout styles", 2005 IEEE International Symposium on Circuits and Systems, May 23-26, 2005.
Malik et al., "Minimization of area in low-resistance MOS switches", Proceedings of the 43rd IEEE Midwest Symposium on Circuits and Systems, Aug. 8-11, 2000.
Morandini et al., "High Frequency Characterization of Compact N+Poly/Nwell Varactor Using Waffle-Layout", 2008 IEEE Topical Meeting on Silicon Monolithic Integrated Circuits in RF Systems, Jan. 23-25, 2008.
Peruzzi et al., "Boosting the MOSFETs matching by using diamond layout style", 2016 31st Symposium on Microelectronics Technology and Devices (SBMicro), IEEE, Aug. 29-Sep. 3, 2016.
Prinzie et al., "Radiation Hardened CMOS Integrated Circuits for Time-Based Signal Processing", Springer International Publishing, © 2018.
Shaneyfelt et al., "Challenges in hardening technologies using shallow-trench isolation", IEEE Transactions on Nuclear Science, vol. 45, No. 6, Dec. 1998, pp. 2584-2592.
Snoeys et al., "A new NMOS layout structure for radiation tolerance", IEEE Transactions on Nuclear Science, vol. 49, No. 4, Aug. 2002, pp. 1829-1833.
Snoeys et al., "Integrated circuits for particle physics experiments", IEEE Journal of Solid-State Circuits, vol. 35, No. 12, Dec. 2000, pp. 2018-2030.
Snoeys et al., "Layout techniques to enhance the radiation tolerance of standard CMOS technologies demonstrated on a pixel detector readout chip", Nuclear Instruments and Methods in Physics Research Section A: Accelerators, Spectrometers, Detectors and Associated Equipment, vol. 439, Nos. 2-3, Jan. 11, 2000, pp. 349-360.
Velazco, et al., "Radiation Effects on Embedded Systems", Springer 2007.
Bastos et al., "Matching of MOS Transistors with Different Layout Styles", Proceedings of the 1996 IEEE International Conference on Microelectronic Test Structures, vol. 9, Mar. 1996, pp. 17-18.
Chan et al., "Edge-extended Design for Improved Flicker Noise Characteristics in 0.13-μm RF NMOS", © 2007 IEEE, pp. 441-444.
Kwon et al., "Effects of shallow trench isolation on low frequency noise characteristics of source-follower transistors in CMOS image sensors", Solid-State Electronics, vol. 119 (2016), pp. 29-32.
Martin-Gonthier et al., "Custom transistor layout design techniques for random telegraph signal noise reduction in CMOS image sensors", Electronics Letters, vol. 46, No. 19, Sep. 16, 2010.
Sallagoity et al., Analysis of Width Edge Effects in Advanced Isolation Schemes for Deep Submicron CMOS Technologies, IEEE Transactions on Electron Devices, vol. 43, No. 11, Nov. 1996, pp. 1900-1906.
Van Den Bosch et al., "A High-Density, Matched Hexagonal Transistor Structure in Standard CMOS Technology for High-Speed Applications", IEEE Transactions on Semiconductor Manufacturing, vol. 13, No. 2, May 2000, pp. 167-172.
Yeh et al., "The Impact of Layout-Dependent STI Stress and Effective Width on Low-Frequency Noise and High-Frequency Performance in Nanoscale nMOSFETs", IEEE Transactions on Electron Devices, vol. 57, No. 11, Nov. 2010, pp. 3092-3100.
Yeh et al, "Layout-Dependent Stress Effect on High-Frequency Characteristics and Flicker Noise in Multifinger and Donut MOSFETs", IEEE Transactions on Electron Devices, vol. 58, No. 9, Sep. 2011, pp. 3140-3146.
International Search Report and Written Opinion dated May 13, 2022 in counterpart Application No. PCT/EP2022/052114 in 14 pages.

* cited by examiner

HYBRID FIELD-EFFECT TRANSISTOR

BACKGROUND

Field

The present disclosure relates to structures of field effect transistors and methods of fabricating field effect transistors.

Description of the Related Art

The miniaturization of field effect transistors (e.g. MOSFETs) has allowed for the development of small integrated circuits with increased transistor density, faster performance and lower power consumption. However, as transistors are increasingly miniaturized into and through the nanometer range, more sophisticated transistor structures are being developed in order to counteract performance limitations that result from their smaller size.

There is a need for transistor structures, in particular field effect transistor structures, which have improved performance at smaller (e.g., nanometer) scales.

SUMMARY

The present disclosure relates to a FET structure. The FET structure has a substrate, an active region, a dielectric layer provided over a channel of the active region and a gate provided over the dielectric layer. The active region comprises a source, a drain and the channel is provided between the source and the drain. The active region is surrounded by an isolation trench, such that width edges of the channel are directly adjacent to the isolation trench. Current paths run between the source and the drain, through the channel. The FET is designed so that current paths running proximal to the channel edges, are reduced or weaker in comparison to a dominant current path running through a center of the channel. One or more of the channel, the dielectric layer or the substrate can be modified or adapted to provide the reduced and dominant current paths. In one example, the center of the channel away from the edges has a first doping concentration of a first conductivity type, and the sides of the channel along the channel edges have a second doping concentration of the first conductivity type, where the second doping concentration is greater than the first doping concentration. In another example, the dielectric layer is thicker over the sides of the channel and thinner over the center of the channel. In another example, regions of the substrate below the sides of the channel have a higher doping concentration than a region of the substrate below the center of the channel. In some examples, the FET structure has both the dielectric layer of different thicknesses and the different doping concentrations in the channel and/or the substrate.

In a first aspect of the present disclosure, there is provided a field effect transistor (FET) comprising a substrate and an active layer comprising a source region, a drain region and a channel region between the source region and the drain region. The FET further comprises a first dielectric layer provided over the channel region, a gate provided over the first dielectric layer and an isolation region adjacent to an edge of the channel region. The channel region comprises a first portion distanced from the edge of the channel region and a second portion in between the first portion and the edge. The FET is configured such that a dominant current path is defined between the source region and the drain region through the first portion of the channel region.

In a second aspect of the present disclosure, there is provided a method of manufacturing a field effect transistor (FET), comprising providing a substrate comprising an isolation region, and forming: an active layer comprising a source region, a drain region, and a channel region in between the source region and the drain region, with a first dielectric layer over the channel region and a gate over the dielectric layer, the channel region comprising an edge adjacent to the isolation region, a first portion distanced from the edge, and a second portion between the first portion and the edge. The method is performed such that a dominant current path is provided through the first portion of the channel region when the FET conducts a current.

In a third aspect of the present disclosure, there is provided a field effect transistor (FET) comprising a substrate and an active layer having a source, a drain, and a channel between the source and the drain, wherein the channel comprises an edge extending in a direction parallel to a current path between the source and the drain. The FET further comprises a dielectric layer over the channel, and a gate over the dielectric layer. One or more of the substrate, the channel and the dielectric layer are configured or formed such that a reduced current path is defined proximal to the edge of the channel.

Further features, embodiments, examples, and advantages of the present disclosure will be apparent from the following description and from the appended claims.

DETAILED DESCRIPTION

Figure 1A:
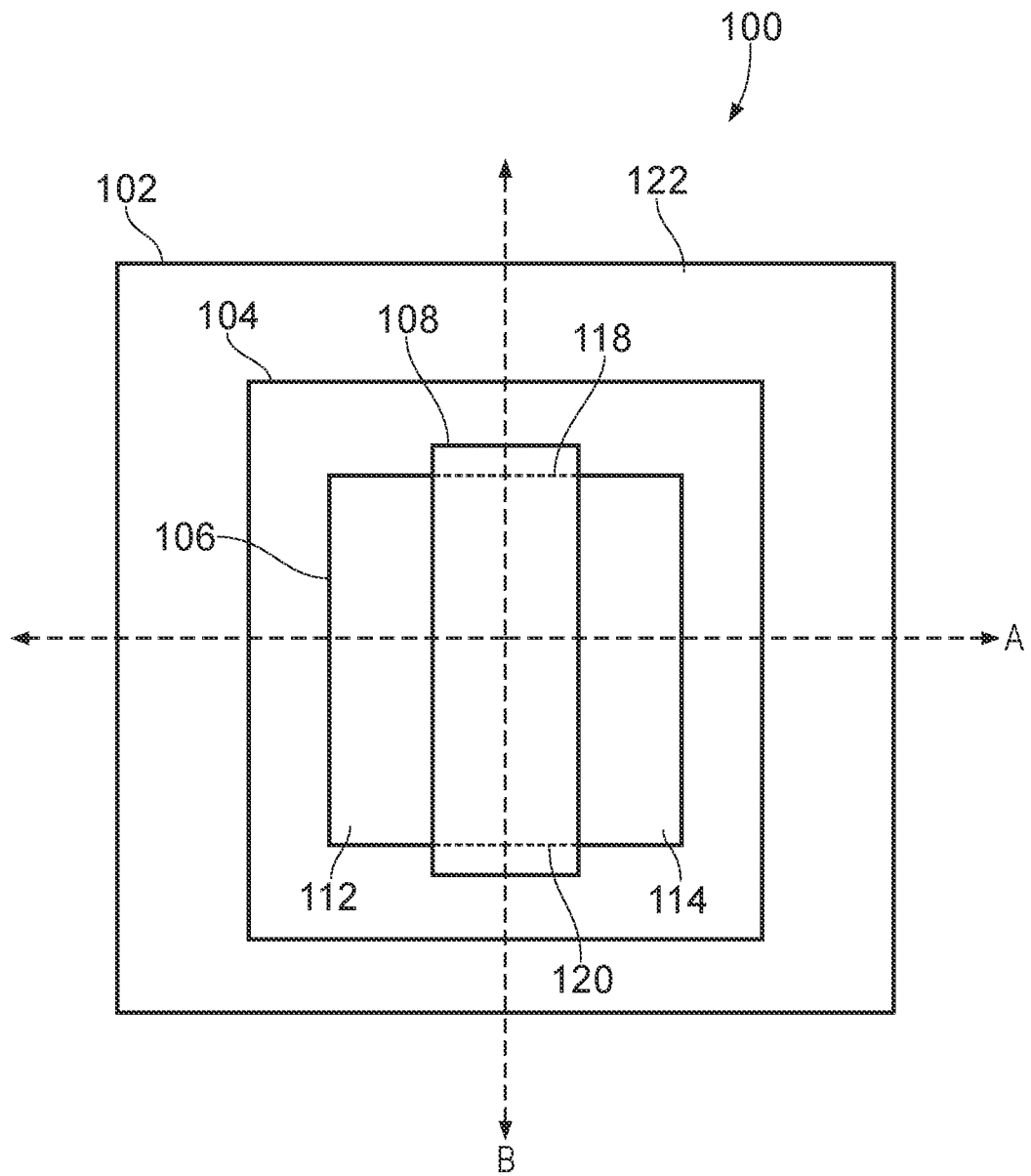
FIG. 1A shows a plan view of an example field effect transistor.

The present disclosure relates to field effect transistor (FET) structures. The FET structures of the present disclosure aim to reduce undesirable effects that occur around the junction between the FET's channel, dielectric layer, and an isolation material around the FET. A FET structure has an active area having a source, drain and a channel in between. The source, channel and drain are ordered in a length direction of the FET. As such, the channel has width edges at the border of the active area. The channel has a first conductivity type (e.g., P-type) and a first doping concentration of dopant(s) of the first conductivity type (i.e. P-type dopant(s)). The source and drain have a second conductivity type (e.g., N-type). During operation, current conducts between the source and the drain via the channel in the length direction. The FET structure also has an isolation trench around the border of the active area. The isolation trench is filled with isolation material, which is different to the material of the active area. Consequently, the width edges of the channel will be adjacent to the isolation trench. Furthermore, the FET structure also has a dielectric layer over the channel that extends across the width of the channel. The dielectric layer further extends over each of the channel width edges, onto the adjacent parts of the isolation trench. A gate is provided over the dielectric layer. Consequently, the FET structure comprises a junction at each channel width edge where the channel width edge and the dielectric layer meets the isolation trench. This region of the FET structure can be the source of undesirable effects, such as large sub-threshold currents, the hump effect, and/or increased trap sensitivities and sensitivities to radiation (e.g. to alpha particles). Furthermore, smaller geometry FETs also have reduced voltage supply ranges as a consequence of the smaller geometry. This reduces the signal voltage range and thus demand even lower noise in practice in order achieve the same level of signal to noise ratio (SNR). Therefore, there is also a need to further reduce the noise power as FET geometries are made smaller.

The FET structures of the present disclosure are constructed to reduce the amount of current flowing through the channel near to the channel width edges during operation. In particular, the FET structures of the present disclosure provide a dominant current path (and/or higher current density) through the center of the channel, and weaker current paths (and/or lower current density) along the sides of the channel near to the channel width edges, when the FET is conducting current. This can be achieved by modifying one or more of the dielectric layer, the channel region or another part of the substrate. In one example, the dominant and weak current paths are provided by the center of the channel having the first doping concentration (e.g., P−) of the first dopant type (e.g., P-type dopant(s)), and the sides of the channel having a higher second doping concentration (e.g., $P^{mod}$) of the first dopant type (e.g., P-type dopant(s)). As a result, the sides of the channel will have a larger threshold voltage than the center of the channel. Therefore the sides of the channel will conduct less current than the center of the channel for a given biasing arrangement of the FET (e.g., for a given drain-source voltage across the FET and/or a given gate-source voltage). In another example, the dominant and weak current paths are provided by the dielectric layer having an increased thickness above the sides of the channel in comparison to over the center of the channel. The sides of the channel will again have a larger threshold voltage than the center of the channel, and therefore the sides of the channel will conduct less current than the center of the channel for a given biasing of the FET (e.g., for a given drain-source voltage across the FET and/or a given gate-source voltage). In some examples, the FET structure can have both the higher doping concentration at the sides of the channel and an increased thickness of the dielectric layer above the sides of the channel. Moreover, in other examples, the dominant and weak current paths can be provided by a region of the substrate below the center of the channel having the first doping concentration of the first conductivity type, and regions of the substrate below the sides of the channel having the higher doping concentration of the first conductivity type.

Consequently, the FET structures of the present disclosure are able to reduce the undesirable effects that occur at the channel width edges by reducing the amount of current flowing near or proximal to the channel width edges. Furthermore, the gain and other performance characteristics of the FET are improved, since the stress imparted on the channel by the isolation trench at the channel width edges has less of an effect on the operation of the FET. Noise characteristics, such as low frequency and/or random telegraph noise (RTN), may also be reduced. Moreover, the FET structures of the present disclosure are highly efficient and cost effective to manufacture. In particular, with the present FET structures, different materials in the channel or the dielectric layer may not be formed or deposited in order to provide the dominant and reduced current paths. Rather, the sides and the center of the channel can be formed of the same semiconductor material whilst only changing the doping concentration or doping amount at the sides and/or the center of the channel. Moreover, the dielectric layer can be formed of substantially the same dielectric material over the center and the sides of the channel, whilst only changing its thickness above the different parts of the channel. Furthermore, with the present FET structures, complex gate shapes are avoided. The gate can also be formed of the same gate material over the center and the sides of the channel. If the gate is a polysilicon gate, then the gate can have substantially the same doping concentration and conductivity type, over both the center and the sides of the channel. The formation of the gate is usually a highly controlled and complex part of the FET fabrication process. Therefore, the FETs of the present disclosure allow for simple and cost effective manufacturing.

Figure 1B:
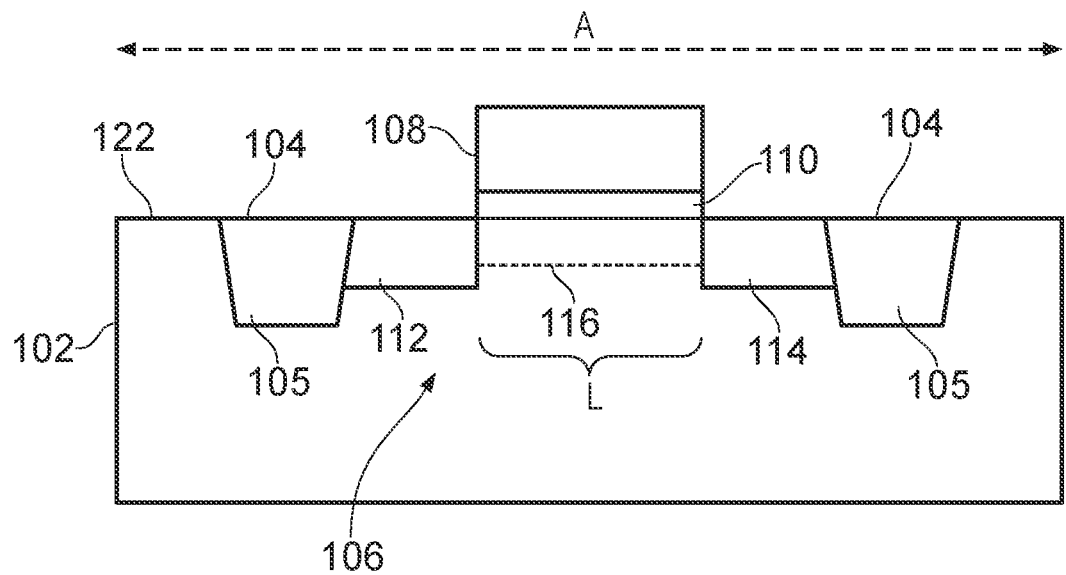
FIG. 1B shows a first cross-sectional view of the field effect transistor of FIG. 1A.
Figure 1C:
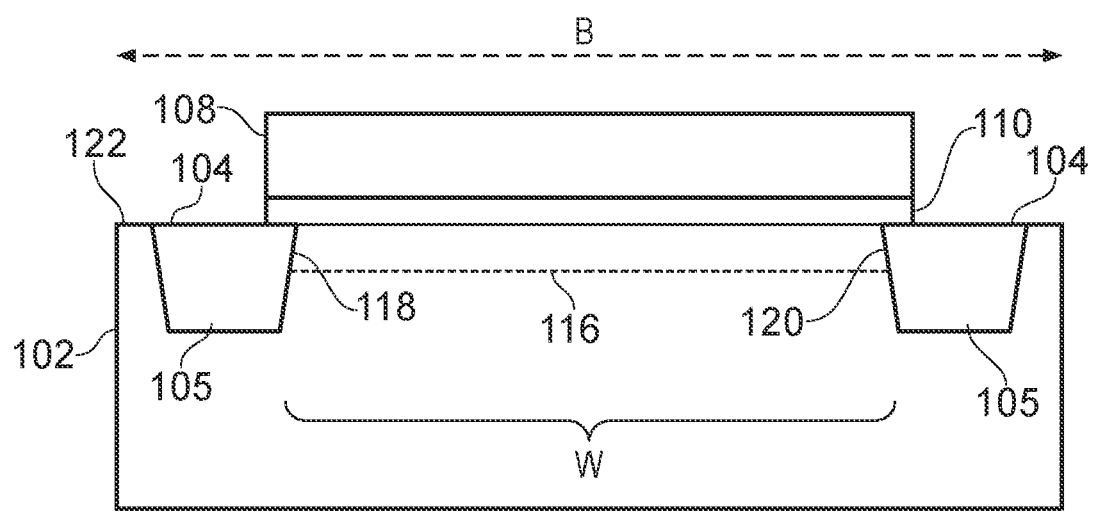
FIG. 1C shows a second cross-sectional view of the field effect transistor of FIG. 1A.

FIGS. 1A-1C show views of an example field effect transistor (FET) 100. The FET 100 can be considered as a planar FET. FIG. 1A shows a plan view of the FET 100. FIG. 1B shows a cross sectional view of the FET 100 across the line A in FIG. 1A. FIG. 1C shows a cross sectional view of the FET 100 across the line B in FIG. 1A. The line A indicates a length direction of the FET 100. The line B indicates a width direction of the FET 100. As such, FIG. 1B shows a cross section of the FET 100 across a length of the FET 100, and FIG. 1C shows a cross section of the FET 100 across a width of the FET 100. Although not shown in the figures, the FET 100 also has a depth direction corresponding to a vertical direction in FIGS. 1B and 1C.

For ease of explanation, the FET 100 is described as a N-type FET. However, it should be appreciated that an example P-type FET may have a corresponding structure to the FET 100 but using complementary conductivity and dopant types.

The FET 100 comprises a substrate 102. The substrate 102 is formed of a semiconductor material having P-type conductivity. In particular, the substrate 102 comprises a doping concentration "P−" of P-type dopant, which provides the substrate 102 with P-type conductivity.

The substrate 102 comprises an active region 106. The active region 106 is formed in a top surface 122 of the substrate 102. The active region 106 may also be considered as an active layer at or directly beneath the top surface 122 of the substrate 102. The active region 106 comprises a source region 112, a drain region 114 and a channel region 116. The source region 112 and the drain region 114 are separated by the channel region 116. For example, the source region 112 occupies one side of the active region 106, the drain region 114 occupies an opposite side of the active region 106, and the channel region 116 is positioned in between the source region 112 and the drain region 114. The channel region 116 extends between the source region 112 and the drain region 114 in the length direction A of the FET 100. As shown in FIG. 1B, the channel region 116 has a length L that extends between the source region 112 and the drain region 114 in the length direction A. Furthermore, the channel region 116 extends across the entire width of the active region 106 in the width direction B. In particular, a border of the active region 106 includes a first channel width edge 118 and a second channel width edge 120 on an opposite side to the first channel width edge 120. The channel region 116 laterally extends between the first channel width edge 118 and the second channel width edge 120 in the width direction B. As shown in FIG. 1C, the channel region 116 has a width W that extends between the first width edge 118 of the channel region 116 and the second width edge 120 of the channel region 116. In some examples, the channel region 116 has a length L of at least 20 nm. In some examples, the channel region 116 has a width W of at least 80 nm. However, it will be appreciated that the dimensions of the channel length and width may vary depending on design rules of FET fabrication processes. Moreover, it will be appreciated that the length L and width W has no upper limit.

The source region 112 and the drain region 114 have N-type conductivity. The source region 112 and the drain region 114 have a doping concentration "N+" of N-type dopant. N+ is large enough to provide the source region 112 and the drain region 114 with N-type conductivity. The channel region 116 and the remainder of the substrate 102 however has P-type conductivity, as discussed above. In particular, the channel region 116 has the doping concentration P− of P-type dopant.

The FET 100 further comprises an isolation region 104. The isolation region 104 is arranged to electrically isolate the active region 106 of the FET 100 from other components or circuitry that might be formed on or in the same substrate 102. The isolation region 104 comprises an isolation trench 105 formed in the top surface 122 of the substrate 102. For example, the isolation trench 105 corresponds to a region of the substrate 102 that has been etched or removed. The isolation trench 105 surrounds and borders the active region 105. Moreover, the isolation trench 105 defines the outer limits or the perimeter of the active region 106. As such, the borders or edges of the active region (i.e. the outer facing edges of the source region 112, drain region 114, and channel region 116 in the width/length plane, as shown in FIG. 1A) are immediately adjacent and/or in contact with the isolation trench 105. More particularly, the channel width edges 118 and 120 of the channel region 116 are immediately adjacent and/or in contact with the isolation trench 105. In some examples, as illustrated in FIGS. 1B-1C, the isolation trench 105 has a depth that extends below the depth of the active region 106. In particular, the depth of the isolation trench 105 extends below the depths of the source region 112 and the drain region 114 and the channel region 116.

The isolation trench 105 comprises isolation material. In particular, the isolation trench 105 is filled with isolation material that differs to the semiconductor material of the substrate 102. The isolation material may be any suitable material known in the art. For example, the isolation material may be an oxide, such as silicon dioxide.

In some examples, the isolation trench 105 is a shallow trench isolation (STI) as is known in the art. However, the isolation trench 105 may alternatively be any other type of isolation that is able to isolate the active region 106 of the FET 100. For example, the isolation trench 105 may alternatively be a Local Oxidation of Silicon (LOCOS) isolation as is known in the art.

The FET 100 further comprises a dielectric layer 110. The dielectric layer 110 is arranged on the top surface 122 of the substrate 102. In particular, the dielectric layer 110 is positioned and/or arranged over the channel region 116. The dielectric layer 110 is dimensioned to cover the channel region 116. The dielectric layer 110 has a length in the length direction A that is long enough to cover the entire length L of the channel region 116. In some examples, the length of the dielectric layer 110 matches the length L of the channel region 116. Furthermore, the dielectric layer 110 has a width in the width direction B that is wide enough to cover the entire width W of the channel region 116. As illustrated, the dielectric layer 110 may have a width that is greater than the width W of the channel region 116, such that the dielectric layer 110 extends over the channel width edges 118 and 120 and onto the isolation region 104.

The FET 100 further comprises a gate 108. The gate 108 is positioned over the dielectric layer 110. The gate 108 has a width and a length corresponding to the width and the length of the dielectric layer 110. As such, the gate 108 also covers the channel region 116. However the gate 108 is separated from the channel region 116 by the dielectric layer 110. The gate 108 may also extend onto the isolation region 104, like the dielectric layer 110.

The regions of overlap between the dielectric layer 110, the gate 108 and the isolation region 104 may be considered as transition regions or divots. Moreover, if the isolation region 104 is a STI, the transition region may be a STI divot. The amount of each overlap in the width direction B may be on the scale of nanometers. Each overlap may be 10-50 nm. Moreover each overlap may typically be about 20 nm. However, each overlap is preferably made as small as possible according to FET fabrication processes. In some examples there is substantially no overlap, i.e. the dielectric layer 110 and the gate 108 does not extend over the channel width edges 118 and 120.

The dielectric layer 110 can be made from any suitable material. For example, the dielectric layer 110 may be made from an oxide (e.g., a thermally grown oxide or any other oxide such as silicon dioxide), or a high-k dielectric material. Furthermore, the gate 108 can be made from any suitable material. In some examples, the gate 108 is a metal gate. In other examples, the gate 108 is a polysilicon gate. In some examples, the dielectric layer 110 is an oxide and the gate 108 is a metal. In other examples, the dielectric layer 110 is a high-k dielectric material and the gate 108 is a polysilicon gate. In some examples, if the gate 108 is a polysilicon gate, the gate 108 has a doping concentration $N^{gate}$ of N-type dopant for a N-type FET.

The isolation region 104 may advantageously allow for manufacturers to manufacture FETs with small geometries, whilst mitigating for short channel and narrow width effects. However, as discussed above, the isolation region 104 is abutted to the sides of the active region 16. More particularly, the isolation region 104 is abutted to or contacts with the channel width edges 118 and 120 of the channel region 116. Furthermore, as shown in FIG. 1C, the gate 108 may abruptly go from being over a relatively thin dielectric layer 110 to over a thicker combination of the dielectric layer 110 and the material in the isolation trench 105. This structure can limit the performance of the FET 100. Performance limitations can result from stresses imparted on the channel region 116 by the isolation region 104. Furthermore, this FET structure can result in the FET 100 exhibiting a larger sub-threshold leakage current, also known as the hump effect.

The examples described below relate to FET structures that are able to overcome the above performance limitations, whilst being cost efficient and simple to manufacture. In particular, as is described below, one or more of the dielectric layer 110, the channel region 116 or another part of the substrate 102 can be modified to provide a dominant current path through a center portion of the channel region 116 and reduced current paths through side portions of the channel region 116 proximal to the channel edges 118 and 120, and therefore overcome the above performance limitations.

Figure 2A:
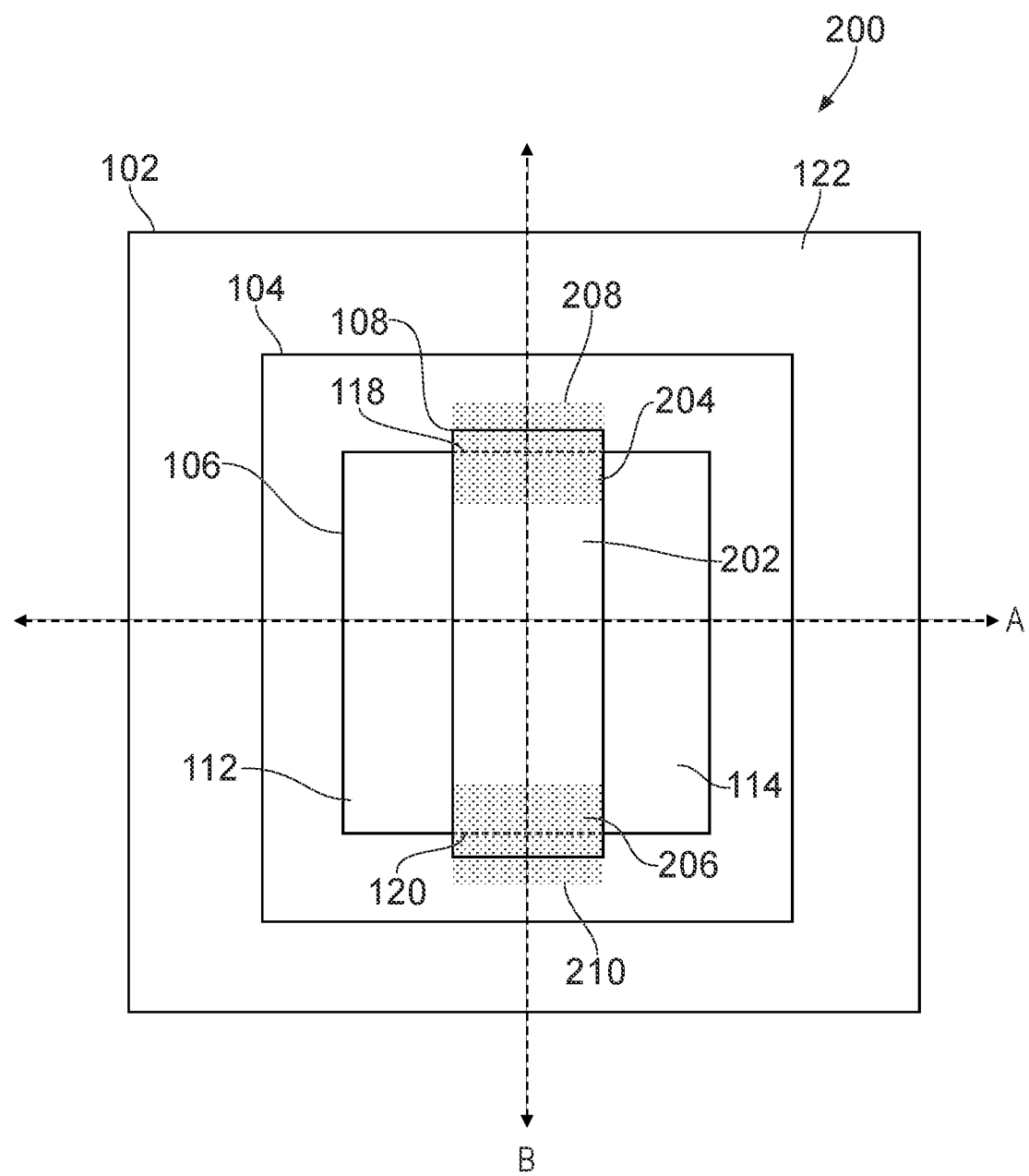
FIG. 2A shows a plan view of a field effect transistor according to an example of the present disclosure.
Figure 2B:
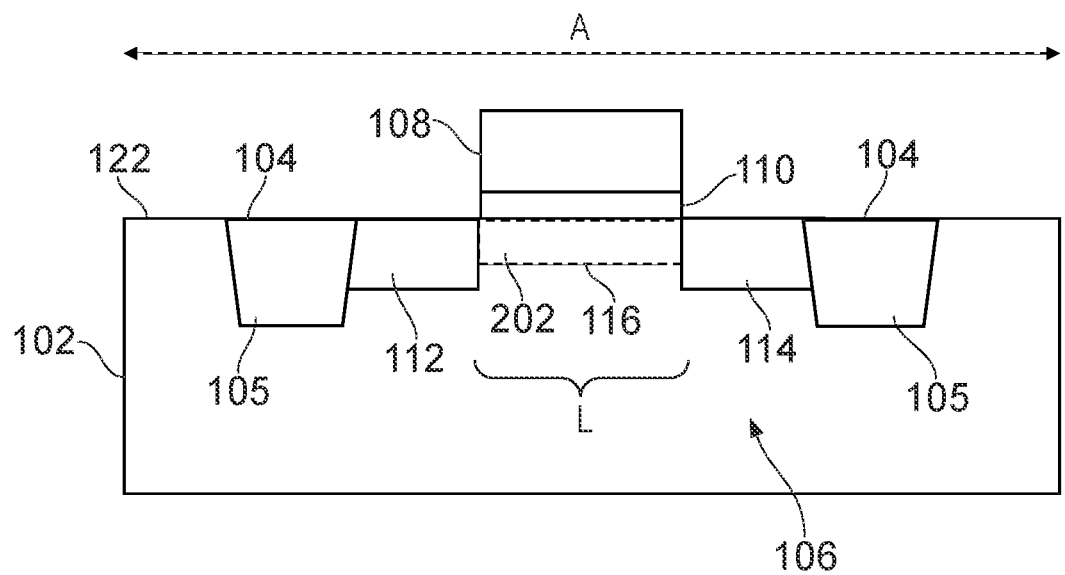
FIG. 2B shows a first cross-sectional view of the field effect transistor of FIG. 2A.
Figure 2C:
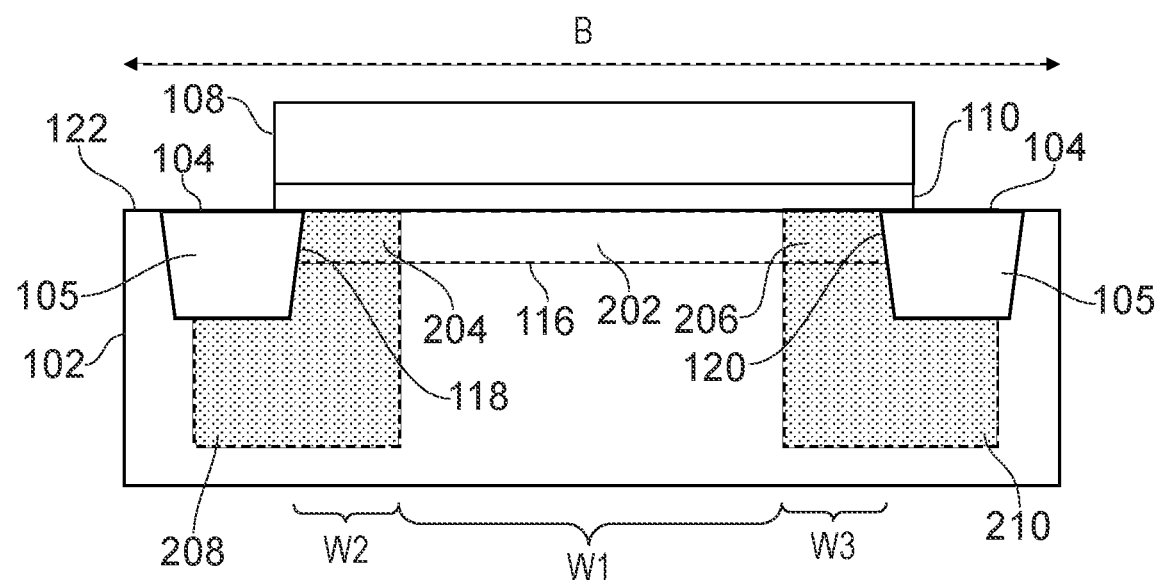
FIG. 2C shows a second cross-sectional view of the field effect transistor of FIG. 2A.

FIGS. 2A-2C show views of a field effect transistor (FET) 200 according to an example of the present disclosure. Reference signs identical to those in FIGS. 1A-1C are used in FIGS. 2A-2C as a reference to like features. As such, the description of those features will not be repeated. However, the FET 200 differs from the FET 100 as described below.

In the FET 200, the channel region 116 comprises a center portion 202, a first side portion 204 and a second side portion 206. The center portion 202 is laterally distanced from the channel width edges 118 and 120 of the channel region 116. The center portion 202 extends between the source region 112 and the drain region 114 in the length direction A of the FET 200. Therefore, the center portion 202 has a length corresponding to the length L of the channel region 116. The center portion 202 however has a width that is smaller than the total width W of the channel region 116. The center portion 202 has a width W1, wherein W1<W.

The first side portion 204 is between the center portion 202 and the channel width edge 118. The first side portion 204 also extends between the source region 112 and the drain region 114 in the length direction A of the FET 200. Therefore, the first side portion 204 also has a length corresponding to the length L of the channel region 116. The first side portion 204 however has a width W2, wherein W2<W.

The second side portion 206 is between the center portion 202 and the channel width edge 120. The second side portion also extends between the source region 112 and the drain region 114. Therefore, the second side portion 206 has a length corresponding to the length L of the channel region 116. The second side portion 206 however has a width W3, wherein W3<W.

The substrate 102 of the FET 200 further comprises a first modified region 208 and a second modified region 210. The first modified region 208 has a volume that contains the first side portion 204 within its volume. In particular, the first modified region 208 has a width, length and a depth that encompasses the first side portion 204. The depth of the first modified region 208 further extends below the depth of first side portion 204 towards a bottom surface of the substrate 102. In particular, the first modified region 208 has a depth greater than the depth of the isolation trench 105. The width of the first modified region 208 also extends laterally across the channel width edge 118, such that the first modified region 208 occupies an area of the substrate 102 underneath the isolation region 104.

The second modified region 210 has a volume that contains the second side portion 206 in its volume. In particular, the second modified region 210 has a width, length and a depth that encompasses the first side portion 204. The depth of the second modified region 210 further extends below the depth of the second side portion 206 towards the bottom surface of the substrate 102. In particular, the second modified region 210 has a depth greater than the depth of the isolation trench 105. The width of the second modified region 210 also extends laterally across the channel width edge 120, such that the second modified region 210 occupies an area of the substrate underneath the isolation region 104. Neither modified region 208 or 210 contains the center portion 202 of the channel region 116.

As discussed above in relation to the FET 100, the source region 112 and the drain region 114 has N-type conductivity with the doping concentration N+. The remainder of the substrate 102, including the channel region 116, have P-type conductivity. In the FET 200, the first and second modified regions 208 and 210 of the substrate 102 still have P-type conductivity. However, the first and second modified regions 208 and 210 have a doping concentration "$P^{mod}$", of p-type type dopant. The doping concentration $P^{mod}$ is different to the doping concentration P−. In particular, the doping concentration $P^{mod}$ is higher or greater than the doping concentration P−.

Since the side portions 204 and 206 of the channel region 116 are within the volume of the modified regions 208 and 210, the side portions 204 and 206 of the channel region 116 also have the higher doping concentration $P^{mod}$. The remaining P-type regions of the substrate 102, including the center portion 202 of the channel region 116, has the doping concentration P−. As such, channel region 116 of the FET 200 is formed of the side portions 204 and 206 having the doping concentration $P^{mod}$ and the center portion 202 having the doping concentration P− that is lower or less than the $P^{mod}$.

The threshold voltage of the FET 200 is dependent on the doping level or concentration of the channel region 116 underneath the dielectric layer 110. Since the doping concentration of the channel region 116 differs across the width W of the channel region 116, the FET 200 will therefore have different threshold voltages at different portions across the width of the channel region 116. A larger or higher doping concentration of the channel generally results in a larger threshold voltage. Therefore, the FET 200 will have a relatively larger threshold voltage at the side portions 204 and 206 of the channel region 116 where the doping concentration of the channel region 116 is $P^{mod}$. The FET 200 will have a relatively lower threshold voltage at the center portion 202 of the channel region 116 where the doping concentration is P−.

Consequently, when the channel region 116 is conducting a current during operation of the FET 200, the channel region 116 will conduct a dominant (e.g., relatively larger) current between the source region 112 to the drain region 114 through the center portion 202 of the channel region 116, for a given biasing arrangement of the FET 200 (e.g., for a given drain-source voltage and/or gate-source voltage of the FET 200). The channel region 116 will conduct a relatively weaker (e.g., relatively lower) current between the source region 112 to the drain region 114 through the side portions 204 and 206 of the channel region 116 for the same biasing arrangement of the FET 200. Additionally or alternatively, the center portion 202 will have a higher current density than the side portions 204 and 206 for a given biasing arrangement of the FET 200.

Figure 2D:
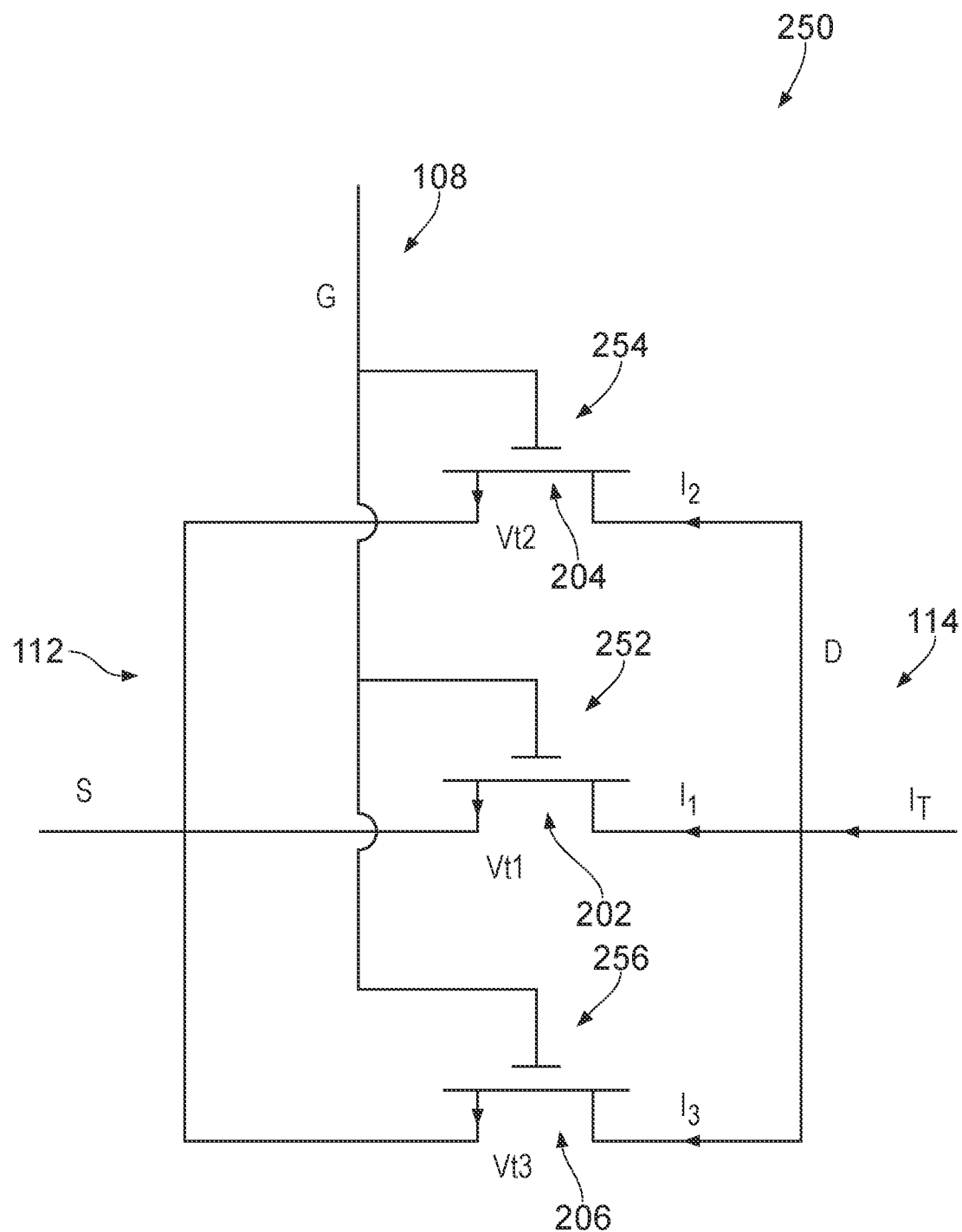
FIG. 2D shows a circuit representation of the field effect transistor of FIGS. 2A-2C.

FIG. 2D shows an example of an equivalent circuit 250 of the FET 200. The circuit 250 comprises internal FETs 252, 254 and 256. The FET 252 may be considered as being formed at least of the source region 112, the drain region 114 and the center portion 202 of the channel 116. The FET 254 may be considered as being formed at least of the source region 112, the drain region 114 and the first side portion 204 of the channel 116. The FET 256 may be considered as being formed at least of the source region 112, the drain region 114 and the second side portion 206 of the channel 116. As such, each of the internal FETs 252, 254 and 256 share the same source S, drain D and gate G, but are formed of different channel portions 202, 204 and 206, respectively. Each FET 252, 254, 256 may have a different respective threshold voltage Vt1, Vt2, Vt3, that is dependent on the doping level or doping concentration of the channel portion of the respective FET. Since the side portions 204 and 206 have the higher doping concentration $P^{mod}$ than the center portion 202, the threshold voltages Vt2 and Vt3 will be higher than Vt1. Under a particular biasing arrangement (e.g., for a given drain-source voltage and/or gate-source voltage), the FET 200 may output an overall current $I_T$. Each internal FET 252, 254 and 256 contributes a respective current I1, I2 and I3 such that $I_T$=I1+I2+I3. Since the internal FETs 254 and 256 have a higher threshold voltage, the current I1 from the internal FET 252 will be greater than the currents I2 and I3 from the respective internal FETs 254 and 256.

Advantageously, by reducing the current flow near the channel width edges 118 and 120, the effects of the above described performance limitations are reduced. Moreover, the FET 200 benefits from having reduced trap sensitivities and more robustness to radiation (e.g., to alpha particles) near the channel width edges 118 and 120, as a result of the reduced current density near the channel width edges. Furthermore, the gain and other performance characteristics of the FET 200 is improved, since the stress imparted on the channel 116 by the isolation region 104 at the channel width edges has less of an effect on the performance of the FET 200.

Additionally, the side portions 204 and 206 and the center portion 202 of the channel region 116 are all formed of the same material (e.g., a uniform material). In particular, the side portions 204 and 206 and the center portion 202 of the channel region 116 are all formed of substantially the same semiconductor material as the substrate 102, like the FET 100. The side portions 204 and 206 only differ from the center portion 202 in that the side portions have a higher doping concentration $P^{mod}$. More generally, the modified regions 208 and 210 of the substrate 102 only differ from the other P-type regions of the substrate 102 in that the modified regions 208 and 210 have a higher doping concentration $P^{mod}$. Therefore, the side portions 204 and 206 of the channel region 116 have different conductive and/or semiconductive properties in comparison to the center portion 202 of the channel region 116, without having to use a different semiconductor material. Advantageously, the FET 200 is relatively simple to manufacture. In particular, different material at the sides or in the center of the channel may not need to be deposited in order to achieve different properties across the channel and provide reduced current densities at the side portions of the channel.

Moreover, with the FET 200, the reduced current paths can be provided at the sides of the channel region 116 without having to modify the shape or the material of the gate 108. Forming the gate 108 is a highly controlled stage of the FET manufacturing process. Therefore, attempts to change the threshold voltage across the FET using non-standard gate shapes or material combinations can lead to many manufacturing difficulties. In the FET 200, the gate 108 can be kept a simple (e.g., rectangular) shape. The gate 108 can also be formed with a uniform material over the side portions 204 and 206 and the center portion 202 of the channel region 116. If the gate 108 is made from polysilicon, the gate 108 can have the same conductivity type and dopant concentration over the side portions 204 and 206 and the center portion 202 of the channel region 116. This means that the manufacturing process can be kept relatively simple.

As discussed above, the widths W1, W2 and W3 of the portions of the channel region 116 are dimensioned such they sum to the total width W of the channel region 116, i.e. W1+W2+W3=W. In some examples, W2<W1, W3<W1 and W2=W3. In such examples, the widths are dimensioned to have a ratio W1=$R_w$×W2=$R_w$×W3. $R_w$ may be 1, 1000 or in the range 1 to 1000. In some examples, $R_w$ is 4, 100 or between 4 and 100. In some examples, the width W1 may be any amount, and the widths W2 and W3 are at most 1 μm. The widths W2 and W3 can be 0.2 μm, 1 μm or in the range 0.2 μm to 1 μm. The widths W2 and W3 may alternatively be 0.5 μm, 1 μm or in the range 0.5 μm to 1 μm. Advantageously, keeping W2 and W3 in these ranges, or at least below 1 μm, may ensure that the FET 200 outputs an acceptable overall level of current. In some examples, W2 may not be identical to W3. Rather, W2 and W3 may instead be different values that individually adhere to the above ranges and examples.

In alternative examples, the depths of the modified regions 208 and 210 may not extend below the bottom of the isolation trench 105. Rather, the modified regions 208 and 210 may extend any distance below the depths of the respective side portions 204 and 206, as long the side portions 204 and 206 are contained in their respective volumes. In one example, the modified regions 208 and 210 may have a depth that is less than the depth of the isolation trench 105. In another example, the modified regions 208 and 210 may have a depth that is equal to the depth of the isolation trench 105. In another example, the modified regions 208 and 210 may have a depth equal to the depth of the side portions 204 and 206, such that the modified regions 208 do not extend below the depth of the side portions 204 and 206 respectively. Similarly, in some examples, the modified regions 208 and 210 may not extend laterally underneath the isolation trench 105. Rather, in some examples, it may be sufficient that only the respective side portions 204 and 206 are contained in the volume of the modified regions 208 and 210.

Figure 3A:
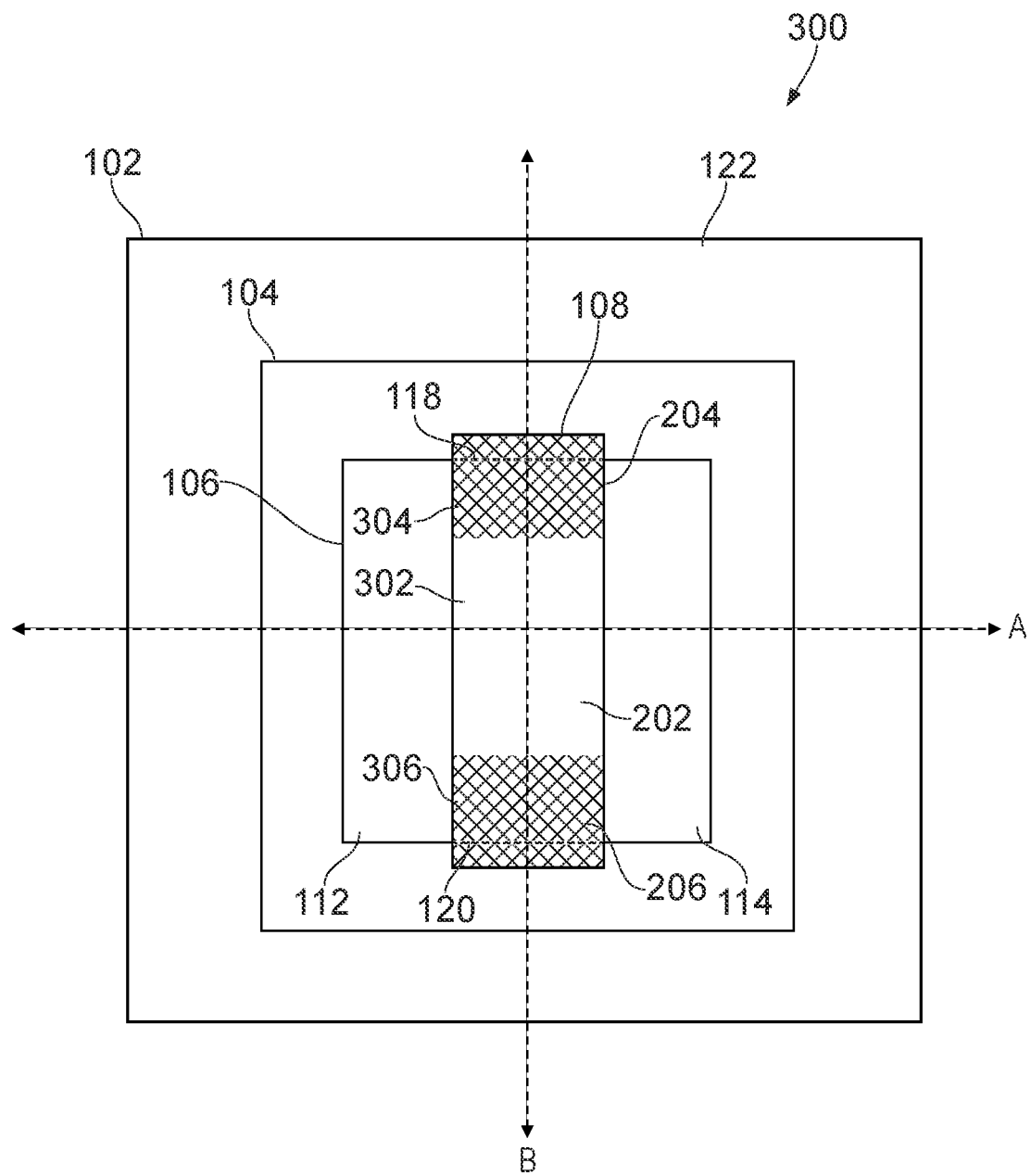
FIG. 3A shows a plan view of a field effect transistor according to another example of the present disclosure.
Figure 3B:
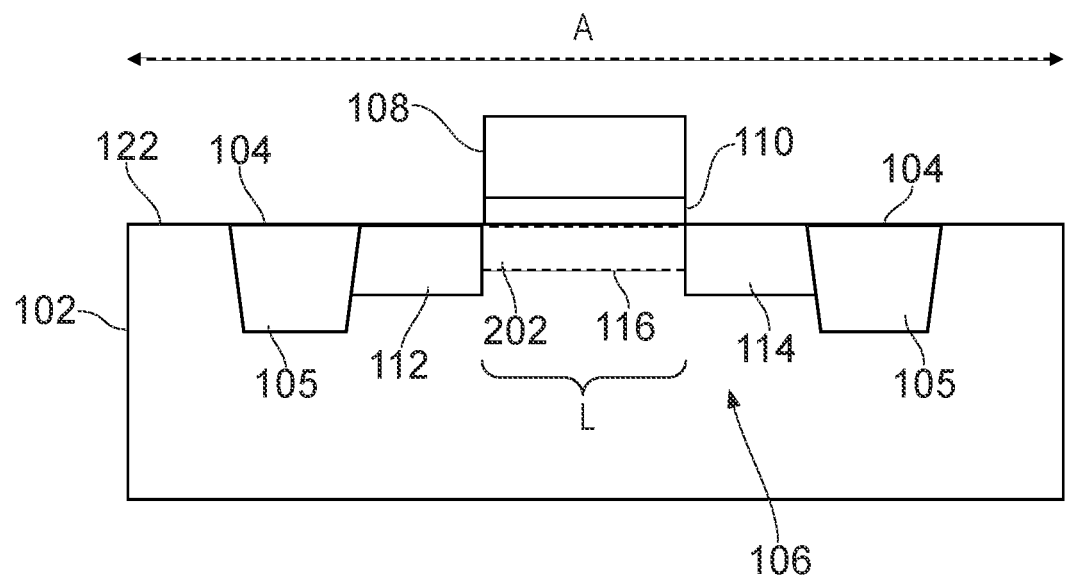
FIG. 3B shows a first cross-sectional view of the field effect transistor of FIG. 3A.
Figure 3C:
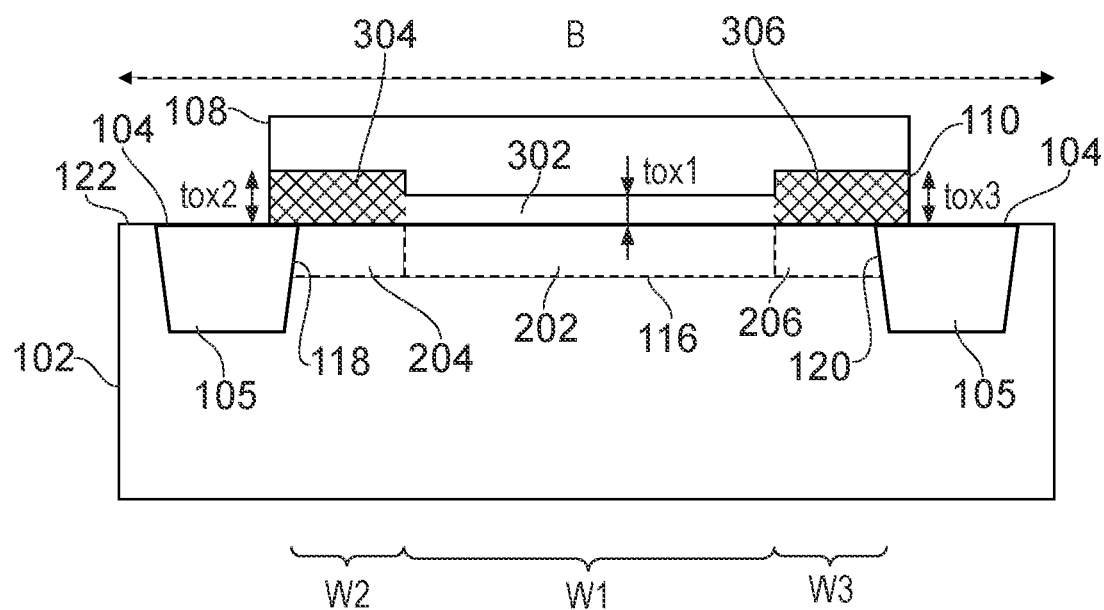
FIG. 3C shows a second cross-sectional view of the field effect transistor of FIG. 3A.

FIGS. 3A-3C show views of a field effect transistor (FET) 300 according to another example of the present disclosure. Reference signs identical to those in FIGS. 1A-1C and FIGS. 2A-2C are used in FIGS. 3A-3C as a reference to like features. As such, the description of those features will not be repeated. However, the FET 300 differs from the FETs 100 and 200 as described below.

In the FET 300, the channel region 116 comprises a center portion 202, a first side portion 204 and a second side portion 206 having respective widths W1, W2 and W3 as described above in respect of the FET 200. However, the substrate 102 of the FET 300 does not have modified regions 208 and 210 as described in respect of the FET 200. Instead, in the FET 300, the dielectric layer 110 is arranged to have a greater or increased thickness over the side portions 204 and 206 of the channel region 116 than over the center portion 202 of the channel region.

The dielectric layer 110 of the FET 300 comprises a center portion 302, a first side portion 304 and a second side portion 306. The center portion 302 of the dielectric layer 110 corresponds to a portion of the dielectric layer 110 that is positioned over and/or covers the center portion 202 of the channel region 116. The center portion 302 of the dielectric layer 110 has a length in the length direction A that is long enough to cover the length of the center portion 202 of the channel region 116. In some examples, the length of the center portion 302 of the dielectric layer 110 matches the length of the center portion 202 of the channel region 116. Furthermore, the center portion 302 of the dielectric layer 110 has a width in the width direction B that is wide enough to cover the width W1 of the center portion 202 of the channel region 116.

The first side portion 304 of the dielectric layer 110 corresponds to a portion of the dielectric layer 110 that is positioned over and/or covers the first side portion 204 of the channel region 116. The first side portion 304 of the dielectric layer 110 has a length in the length direction A that is long enough to cover the length of the first side portion 204 of the channel region 116. In some examples, the length of the first side portion 304 of the dielectric layer 110 matches the length of the first side portion 204 of the channel region 116. In other examples, the length of the first side portion 304 of the dielectric layer is longer than the length of the first side portion 204 of the channel region 116, such that the first side portion 304 of the dielectric layer 110 extends over the source region 112 and the drain region 114. Furthermore, the first side portion 304 of the dielectric layer 110 has a width in the width direction B that is wide enough to cover the width W2 of the first side portion 204 of the channel region 116. As illustrated, the first side portion 304 the dielectric layer 110 may have a width that is greater than the width W2 of first side portion 204 of the channel region 116, such that first side portion 304 of the dielectric layer 110 extends over the channel width edge 118 and onto the isolation region 104. This overlap or transition region may be considered as a divot, as is described above for the FET 100. Alternatively, the first side portion 304 the dielectric layer 110 may have a width that is equal to the width W2 of first side portion 204 of the channel region 116 such that the first side portion 304 does not extend over the channel width edge 118.

The second side portion 306 of the dielectric layer corresponds to a portion of the dielectric layer 110 that is positioned over and/or covers the second side portion 206 of the channel region 116. The second side portion 306 of the dielectric layer 110 has a length in the length direction A that is long enough to cover the length of the second side portion 206 of the channel region 116. In some examples, the length of the second side portion 306 of the dielectric layer 110 matches the length of the second side portion 206 of the channel region 116. In other examples, the length of the second side portion 306 of the dielectric layer is longer than the length of the second side portion 206 of the channel region 116, such that the second side portion 306 of the dielectric layer 110 extends over the source region 112 and the drain region 114. Furthermore, the second side portion 306 of the dielectric layer 110 has a width in the width direction B that is wide enough to cover the width W3 of the first side portion 206 of the channel region 116. As illustrated, the second side portion 306 the dielectric layer 110 may have a width that is greater than the width W3 of second side portion 206 of the channel region 116, such that second side portion 306 of the dielectric layer 110 extends over the channel width edge 120 and onto the isolation region 104. This overlap or transition region may be considered as a divot, as is described above for the FET 100. Alternatively, the second side portion 306 the dielectric layer 110 may have a width that is equal to the width W3 of second side portion 206 of the channel region 116 such that the second side portion 306 does not extend over the channel width edge 120.

The center portion 302 of the dielectric layer 110 has a thickness tox1 in the depth direction of the FET 300. The first side portion 304 of the dielectric layer 110 has a thickness tox2 in the depth direction. The second side portion 306 of the dielectric layer 110 has a thickness tox3 in the depth direction, wherein tox2=tox3. As illustrated, the thicknesses tox1, tox2, tox3 are sized such that tox1<tox2 and tox1<tox3. The thicknesses tox1, tox2 and tox3 may be dimensioned such that tox3=tox2=tox1×$R_{ox}$. The ratio $R_{ox}$ can be 1, 5 or between 1 and 5. In some examples, Rox=2 or Rox=4. The ratio Rox can be selected based on the voltage rating of the FET 300. Therefore it will be appreciated that any ratio Rox is within the scope of the present disclosure.

The threshold voltage of the FET 300 will be dependent on the thickness of the dielectric layer 110. Since the dielectric layer 110 is thicker above the side portions 204 and 206 of the channel region 116, the FET 300 will have a larger threshold voltage at the center portion 202 of the channel region 116 than at the side portions 204 and 206 of the channel region 116. Consequently, when the channel region 116 is conducting a current during operation of the FET 300, the channel region 116 will conduct a dominant (e.g., relatively higher) current through the center portion 202 for a given biasing arrangement of the FET 300 (e.g., for a given drain-source voltage and/or gate-source voltage of the FET 300). The channel region 116 will conductive a relatively weaker or lesser current through the side portions 204 and 206 for the same biasing arrangement of the FET 300. Alternatively or additionally, the center portion 202 will have a higher current density than the side portions 204 and 206 for a given biasing arrangement of the FET 300.

Figure 3D:
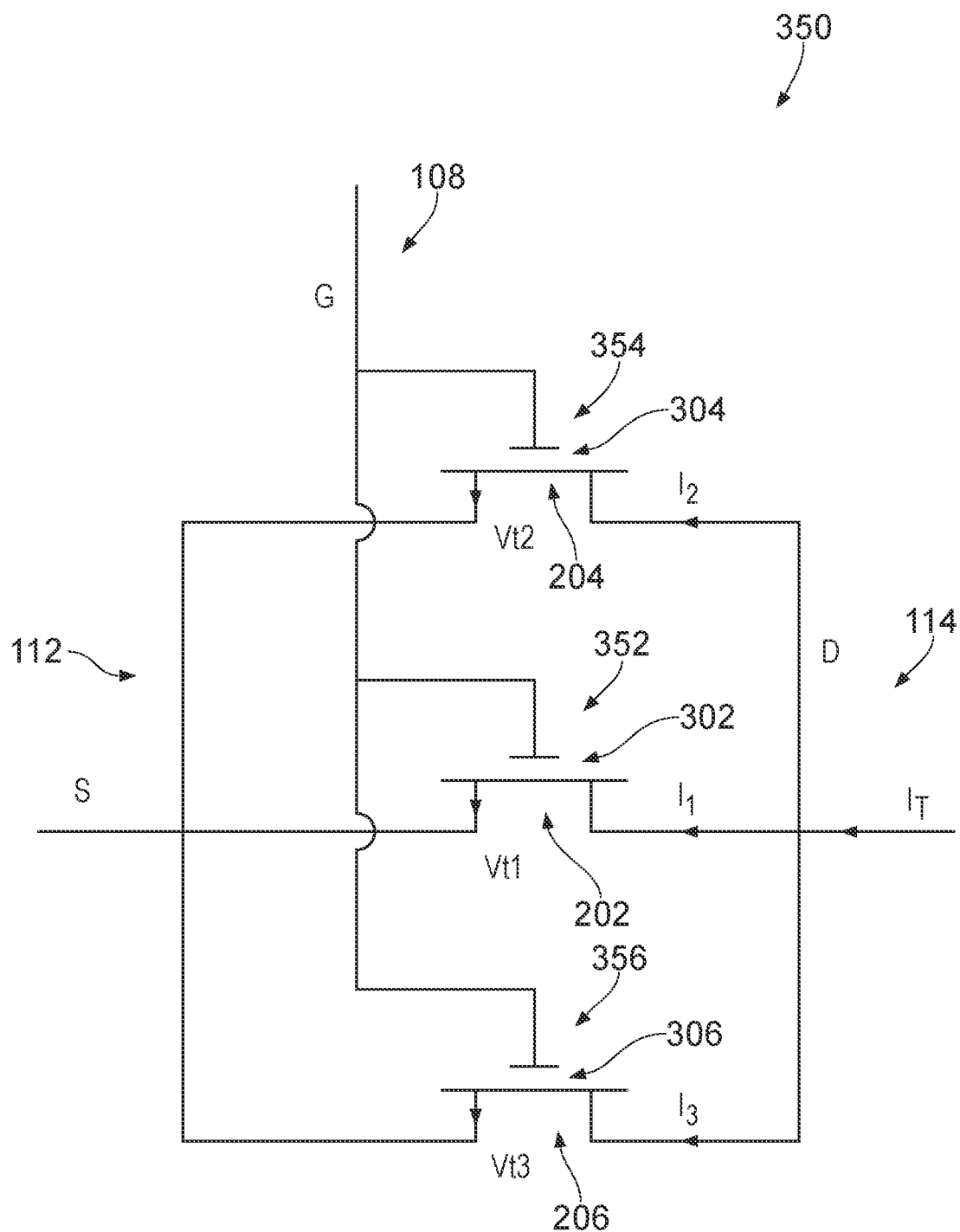
FIG. 3D shows a circuit representation of the field effect transistor of FIGS. 3A-3C.

FIG. 3D shows an example of an equivalent circuit 350 of the FET 300. The circuit 350 comprises internal FETs 352, 354 and 356. The FET 352 may be considered as being formed at least of the source region 112, the drain region 114, the center portion 202 of the channel 116 and the center portion 302 of the dielectric layer. The FET 354 may be considered as being formed at least of the source region 112, the drain region 114, the first side portion 204 of the channel 116 and the first side portion 304 of the dielectric layer 110. The FET 356 may be considered as being formed at least of the source region 112, the drain region 114, the second side portion 206 of the channel 116, and the second side portion 306 of the dielectric layer 110. As such, each of the internal FETs 352, 354 and 356 share the same source S, drain D and gate G, but are formed of different channel portions and dielectric portions. Each FET 352, 354, 356 may have a different respective threshold voltage Vt1, Vt2, Vt3, that is dependent on the thickness of the dielectric portion of the respective internal FET. Since the FETs 354 and 356 have thicker dielectric portions 304 and 306, the threshold voltages Vt2 and Vt3 will be higher than Vt1. Under a particular biasing arrangement (e.g., for a given drain-source voltage and/or gate-source voltage), the FET 300 may output an overall current $I_T$. Each internal FET 352, 354 and 356 contributes a respective current I1, I2 and I3 such that $I_T$=I1+I2+I3. Since the internal FETS 354 and 356 have a higher threshold voltage, the current I1 from the internal FET 352 will be greater than the currents I2 and I3 from the respective internal FETs 354 and 356.

Advantageously, by reducing the current flow near the channel width edges 118 and 120, the effects of the above described performance limitations are reduced, similarly to the FET 200. Moreover, the FET 300 benefits from having reduced trap sensitivities and more robustness to radiation (e.g., to alpha particles) near the channel width edges 118 and 120, as a result of the reduced current density near the channel width edges. Furthermore, the gain and other performance characteristics of the FET 300 is improved, since the stress imparted on the channel 116 by the isolation region 104 at the channel width edges has less of an effect on the operation of the FET 200.

Additionally, the center portion 302 and the side portions 304 and 306 of the dielectric layer 110 are preferably formed of the same (e.g., a uniform) material. In particular, the side portions 304 and 306 and the center portion 302 of the dielectric layer 110 are all formed of substantially the same dielectric material having the same material properties (e.g., the dielectric properties, charge content, and/or dielectric constant). The side portions 304 and 306 only differ from the center portion 302 in that the side portions have a greater thickness tox2=tox3. Consequently, the center portion 202 of the channel region 116 can be made to conduct more current than the side portions 204 and 206 of the channel region 116 during operation of the FET 300, without having to use more than one dielectric material in the dielectric layer 110. Advantageously, the FET 300 is relatively simple to manufacture. In particular, different material at the sides or in the center of the dielectric layer may not need to be deposited in order to achieve different conduction properties across the FET and provide reduced current densities at the side portions of the channel.

Moreover, with the FET 300, the reduced current paths can be provided at the sides of the channel region 116 without having to modify the shape or the material of the gate 108. Forming the gate 108 is a highly controlled stage of the FET manufacturing process. Therefore, attempts to change the threshold voltage across the FET using non-standard gate shapes or material combinations can lead to many manufacturing difficulties. In the FET 300, the gate 108 can be kept a simple (e.g., rectangular) shape. The gate 108 can also be formed with a uniform material over the side portions 304 and 306 and the center portion 302 of the dielectric layer 110. If the gate 108 is made from polysilicon, the gate 108 can have the same conductivity type and dopant concentration over the side portions 304 and 306 and the center portion 302 of the dielectric layer. This means that the manufacturing process can be kept relatively simple.

It will be appreciated that it is sufficient for the side portions 304 and 306 of the dielectric layer 110 to have the increased thicknesses tox2 and tox3 only over side portions 204 and 206 of the channel region 116. As such, in examples where the side portions 304 and 306 of the dielectric layer 110 extend onto the isolation region 104, the sections of the side portions 304 and 306 that are over the isolation region 104 may have a different (e.g., lesser or greater) thickness to the thicknesses tox2 and tox3 of the sections that are over the side portions 204 and 206, respectively. Additionally or alternatively, in examples where the side portions 304 and 306 of the dielectric layer 110 extend onto the source 112 or drain 114 regions, the sections of the side portions 304 and 306 that are over the source 112 or drain 114 regions may have a different (e.g., lesser or greater) thickness to the thicknesses tox2 and tox3 of the sections that are over the side portions 204 and 206, respectively.

Figure 4A:
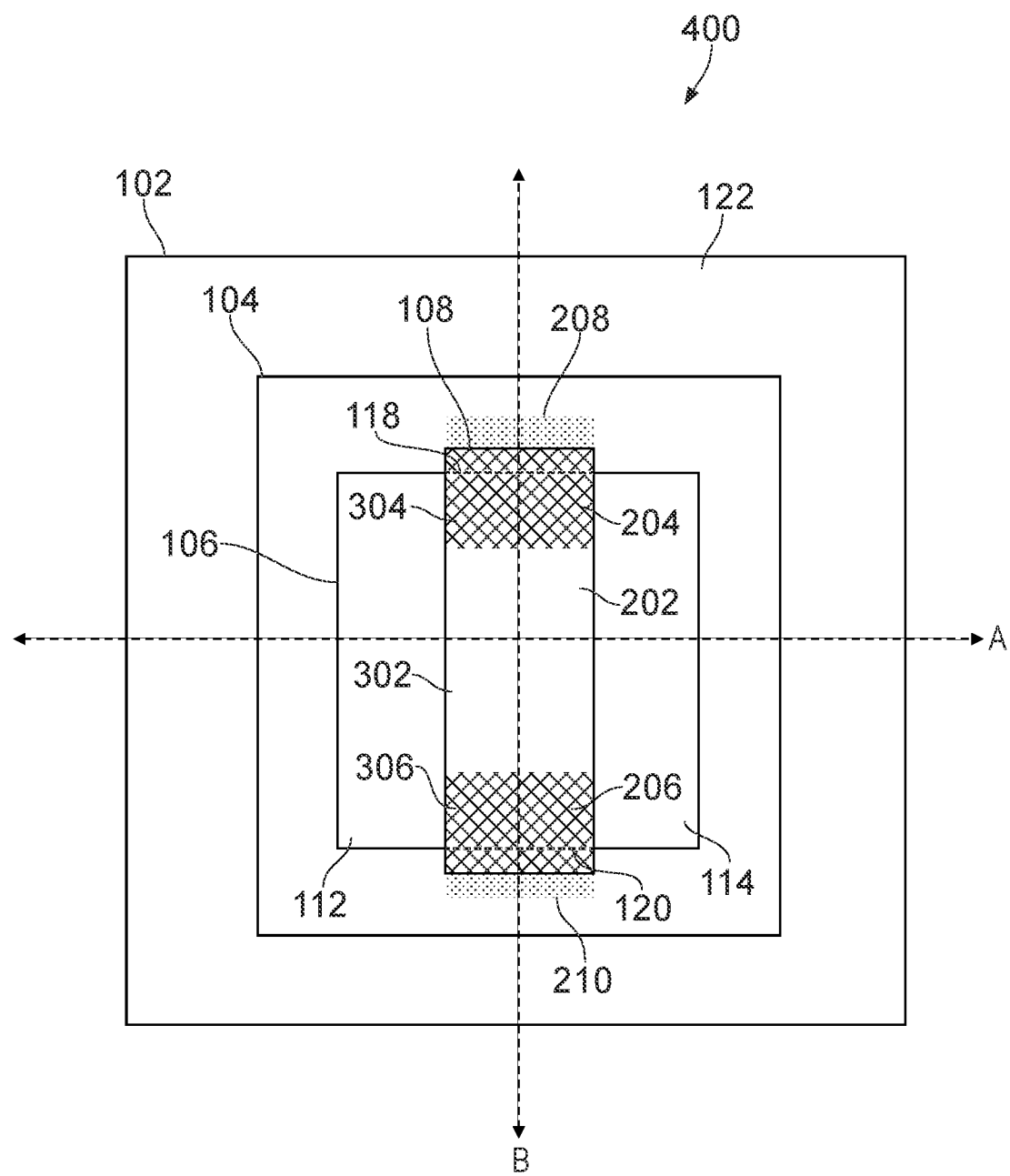
FIG. 4A shows a plan view of a field effect transistor according to another example of the present disclosure that corresponds to a combination of the examples of FIGS. 2A-2C and 3A-3C.
Figure 4B:
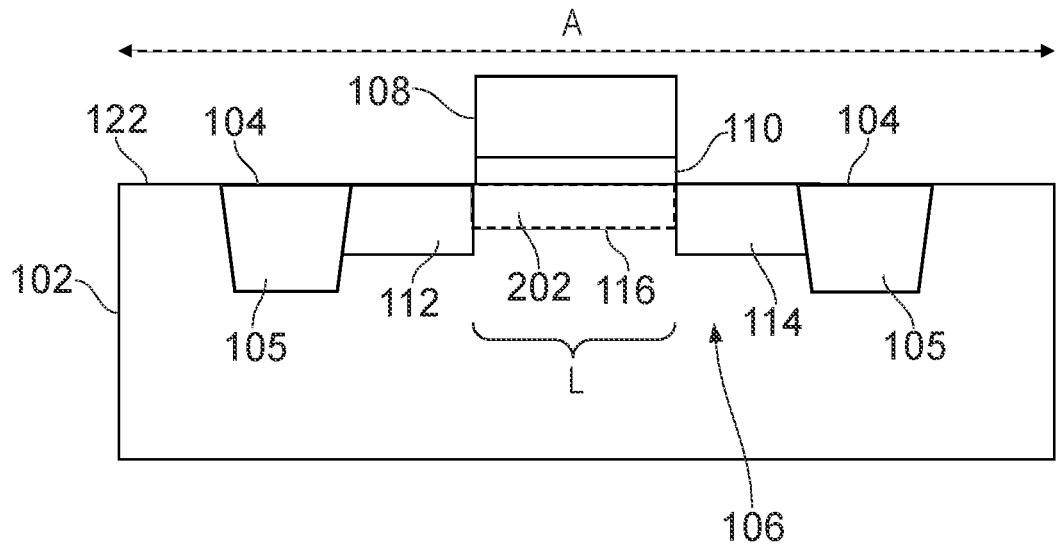
FIG. 4B shows a first cross-sectional view of the field effect transistor of FIG. 4A.
Figure 4C:
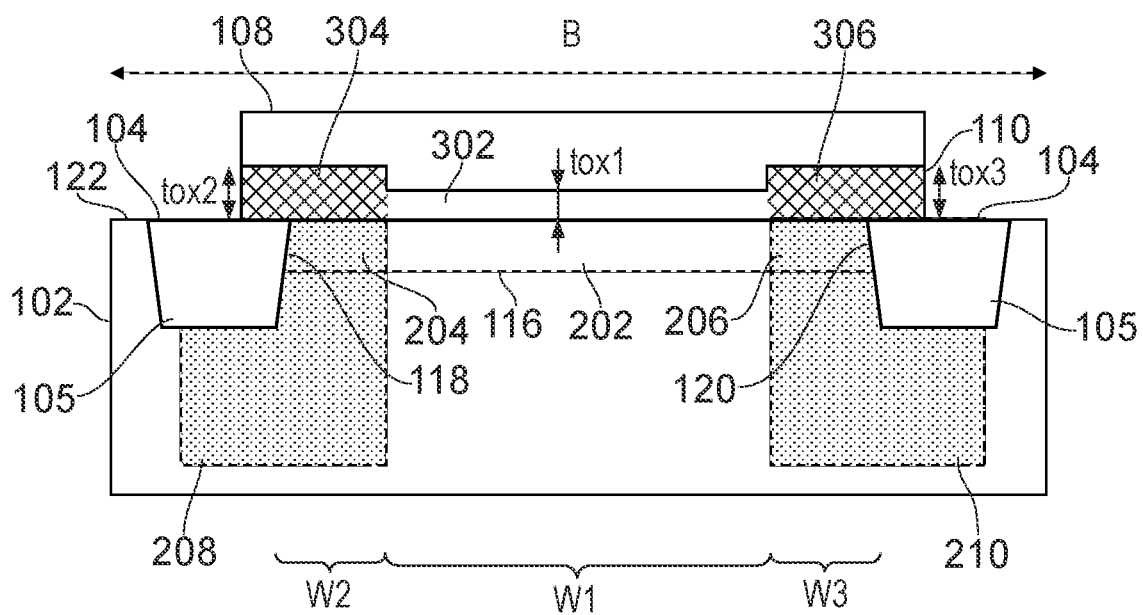
FIG. 4C shows a second cross-sectional view of the field effect transistor of FIG. 4A.

FIGS. 4A-4C show views of a field effect transistor (FET) 400 according to another example of the present disclosure. In particular, the FET 400 corresponds to a combination of the FET 200 and the FET 300 already described above. Reference signs identical to those in FIGS. 1A-1C, FIGS. 2A-2C and FIGS. 3A-3C, are used in FIGS. 4A-4C as a reference to like features. As such, the description of those features will not be repeated in detail.

As illustrated in FIGS. 4A-4C, the substrate 102 of the FET 400 comprises modified regions 208 and 210 of the substrate 102 that contain the side portions 204 and 206 of the channel region 116 and have the higher doping concentration level $P^{mod}$ as already described above in respect of the FET 200. Furthermore, the dielectric layer 110 of the FET 400 is also thicker over side portions 204 and 206 of the channel region 116 than over the central portion 202 of the channel region 116, as already described above in respect of the FET 300.

By combining the structures of the FETs 200 and 300, the threshold voltage at the side portions 204 and 206 of the FET 400 can be further increased. In particular, both increasing the thickness of the dielectric layer 110 above the side portions 204 and 206, and increasing the doping concentration of the side portions 204 and 206, will have the effect of further increasing the threshold voltage at the side portions 204 and 206, and thus further reducing the current paths and/or current density in the side portions 204 and 206. As such, the current paths and/or current density in the side portions 204 and 206 can be further reduced, whilst ensuring that each of the modified regions 208 and 210 of increased doping concentration $P^{mod}$ and the side portions 304 and 306 of the dielectric layer with increased thicknesses tox2=tox3, stay within reasonable limits of the design rules of FET fabrication processes. Moreover, having the option to vary both the thickness of the dielectric layer 110 above the different portions of the channel 116 and the doping concentration of the different portions of the channel 116 means that the different threshold voltages Vt1, Vt2 and Vt3 at the different parts of the channel can be more precisely tuned.

Figure 4D:
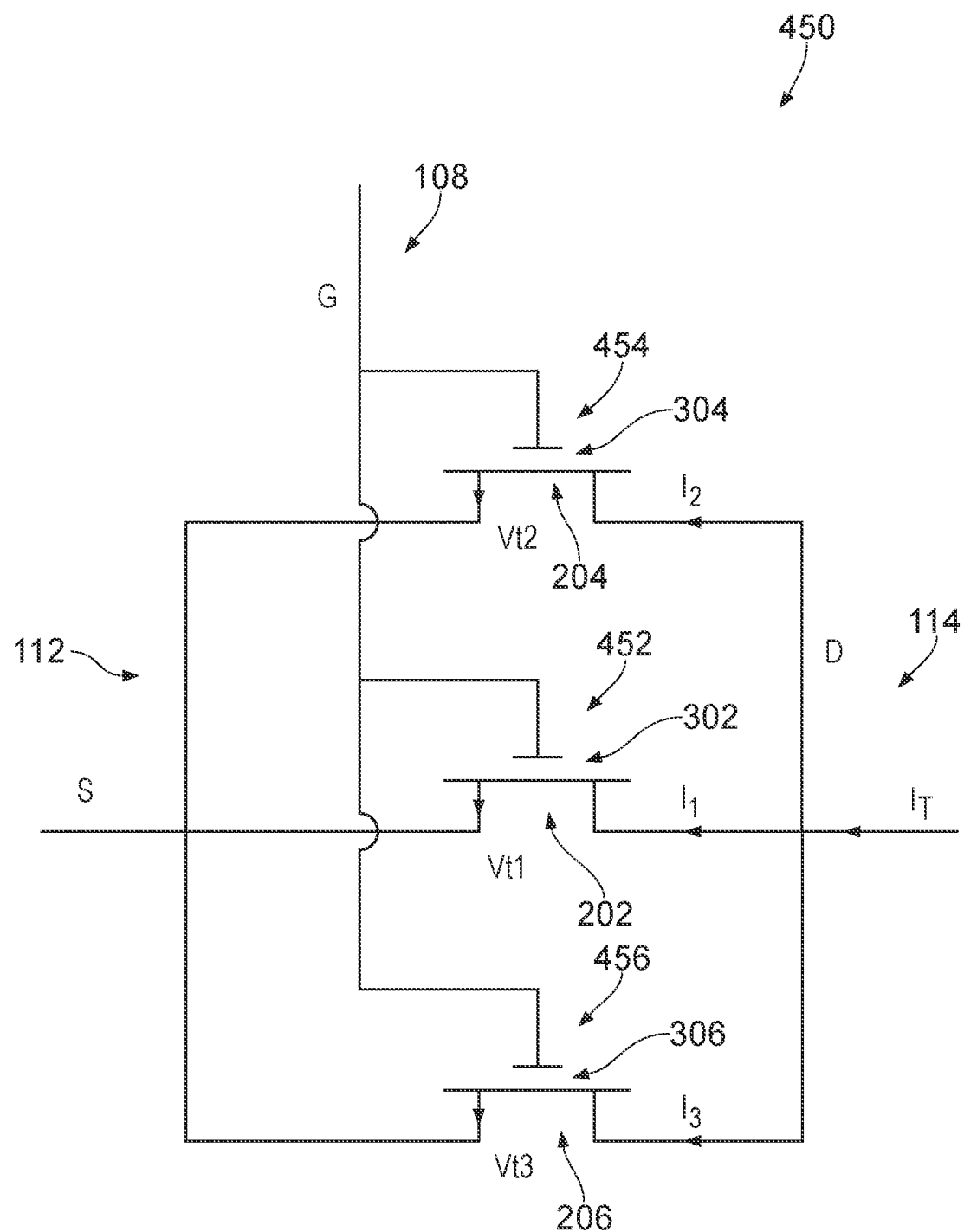
FIG. 4D shows a circuit representation of the field effect transistor of FIGS. 4A-4C.

For illustrative purposes, FIG. 4D shows an example of an equivalent circuit 450 of the FET 400. The circuit 450 comprises internal FETs 452, 454 and 456. The FET 452 may be considered as being formed at least of the source region 112, the drain region 114, the center portion 202 of the channel 116 and the center portion 302 of the dielectric layer. The FET 454 may be considered as being formed at least of the source region 112, the drain region 114, the first side portion 204 of the channel 116 and the first side portion 304 of the dielectric layer 110. The FET 456 may be considered as being formed at least of the source region 112, the drain region 114, the second side portion 206 of the channel 116 and the second side portion 306 of the dielectric layer 110. As such, each of the FETs 452, 454 and 456 share the same source S, drain D and gate G, but are formed of different channel portions and dielectric portions. Each internal FET 452, 454, 456 may have a different respective threshold voltage Vt1, Vt2, Vt3, that is dependent on both the thickness of the respective dielectric portion of that FET and the doping concentration of the respective channel portion of that FET. Since the FETs 454 and 456 have thicker dielectric portions 304 and 306 and the higher doping concentration $P^{mod}$ in the side portions 204 and 206, the threshold voltages Vt2 and Vt3 will be higher than Vt1. Under a particular biasing arrangement (e.g., for a given drain-source voltage and/or gate-source voltage), the FET 400 may output an overall current $I_T$. Each internal FET 452, 454 and 456 contributes a respective current I1, I2 and I3 such that $I_T$=I1+I2+I3. Since the internal FETS 454 and 456 have a higher threshold voltage, the current I1 from the internal FET 452 will be greater than the currents I2 and I3 from the respective internal FETs 454 and 456. As such, the FET 400 can achieve the same advantages and benefits of the FETs 200 and 300 described above.

Figure 5A:
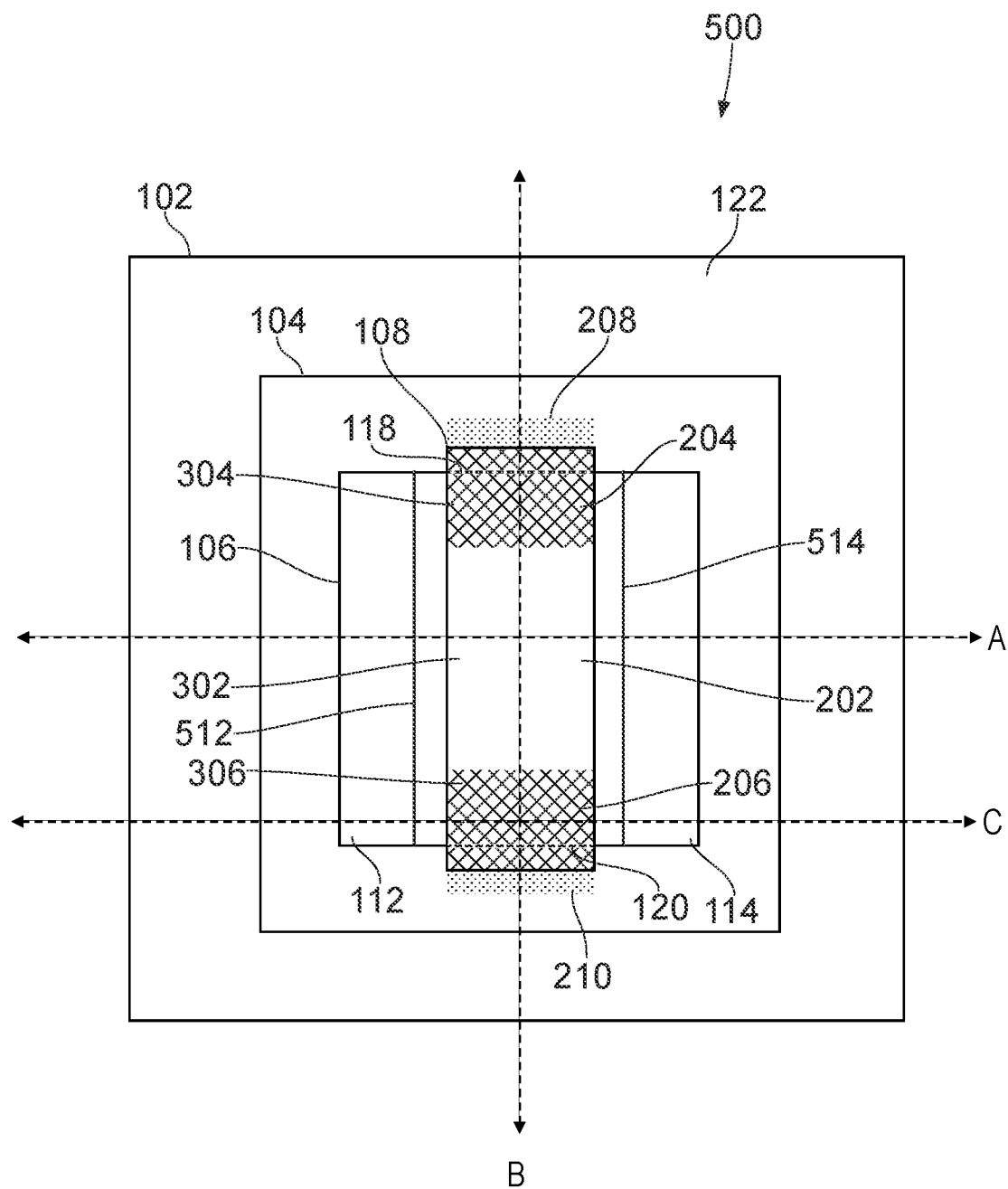
FIG. 5A shows a plan view of a field effect transistor according to another example of the present disclosure.
Figure 5B:
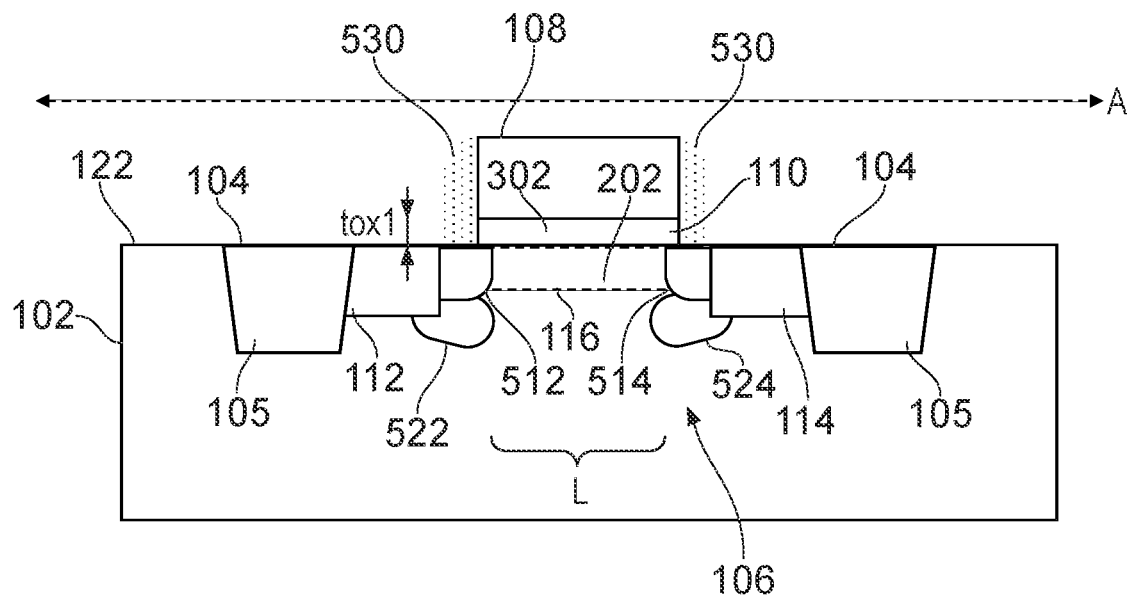
FIG. 5B shows a first cross-sectional view of the field effect transistor of FIG. 5A.
Figure 5C:
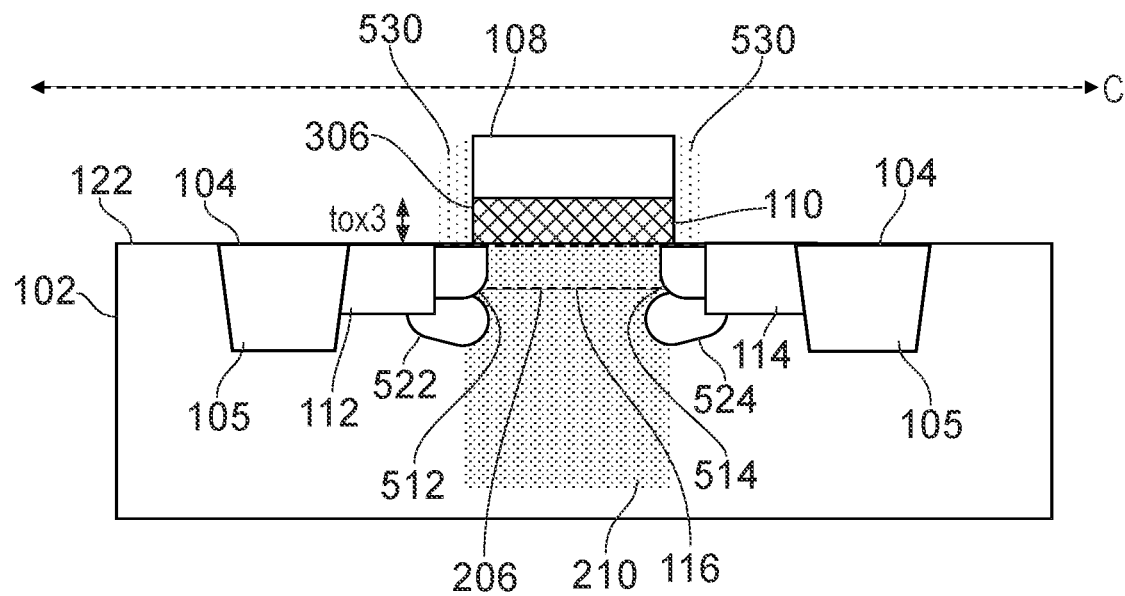
FIG. 5C shows a second cross-sectional view of the field effect transistor of FIG. 5A.

FIGS. 5A-5C show views of a field effect transistor (FET) 500 according to another example of the present disclosure. In particular, the example of FIGS. 5A-5C illustrates a modification of the FET 400.

The FET 500 differs from the FET 400 in that the active region 106 of the FET 500 further comprises a first extension region 512 and a second extension region 514. The first extension region 512 is positioned between the source region 112 and the channel region 116. The first extension region 512 has a width that extends across the entire width W of the channel region 116. The first extension region 512 has a length that extends between the source region 112 and the channel region 116. Also illustrated are sidewall spacers 530 disposed on opposing sidewalls of the gate 108.

The second extension region 514 is positioned between the drain region 114 and the channel region 116. The second extension region 514 has a width that extends across the entire width W of the channel region 116. The second extension region 514 has a length that extends between the drain region 114 and the channel region 116. The second extension region 514 may have a depth that is equal to or less than the depth of the source region 114.

As discussed above, the source region 112 and the drain region 114 have N-type conductivity. In particular, the source region 112 and the drain region 114 have the doping concentration N+ of N-type dopant. In the FET 500, the extension regions 512 and 514 also have N-type conductivity. In some examples, the extension regions 512 and 514 also have the doping concentration N+ of N-type dopant. In other examples, the extension regions 512 and 514 have a doping concentration $N^{ext}$ of N-type dopant that is different to the doping concentration N+. $N^{ext}$ may be less than or greater than N+. As such, the extension regions 512 and 514 can be considered as extensions of the source region 112 and the drain region 114, into the channel region 116.

Additionally or alternatively, the FET 500 may comprise a first pocket region 522 and a second pocket region 524. The first pocket region 522 is provided below and immediately adjacent to the first extension region 512 and extends across the width of the channel region 116. The second pocket region 524 is provided below and immediately adjacent to the second extension region 514 and extends across the width of the channel region 116.

As discussed above, the substrate 102 generally has the first doping concentration P− of a P-type dopant. The pocket regions 522 and 524 also have P-type conductivity. However, the pocket regions 522 and 524 preferably have a doping concentration $P^{pock}$ of P-type dopant that is higher than the first doping concentration P−. Alternatively, $P^{pock}$ may be less than or equal to P−.

Advantageously, the FET structure 400 can be combined with drain engineering techniques to further enhance the properties of the FET. For example, the extension regions 512 and 514 allow the FET 500 to be operated with a larger drain-to-source voltage. The extension regions 512 and 514 may also provide a gradient electric field at the drain region to improve the reliability of the FET 500, as well as improving hot carrier injection and punch through characteristics. Furthermore, the pocket regions 522 and 524 may allow for improvements over short channel effects and effects of current leakage into the substrate 102.

Although the FET 500 has been described as a modification of the FET 400, it should be appreciated that any of the FETs 200 or 300 may also be modified to comprise extension regions and/or pocket regions as is described above.

Figure 14A:
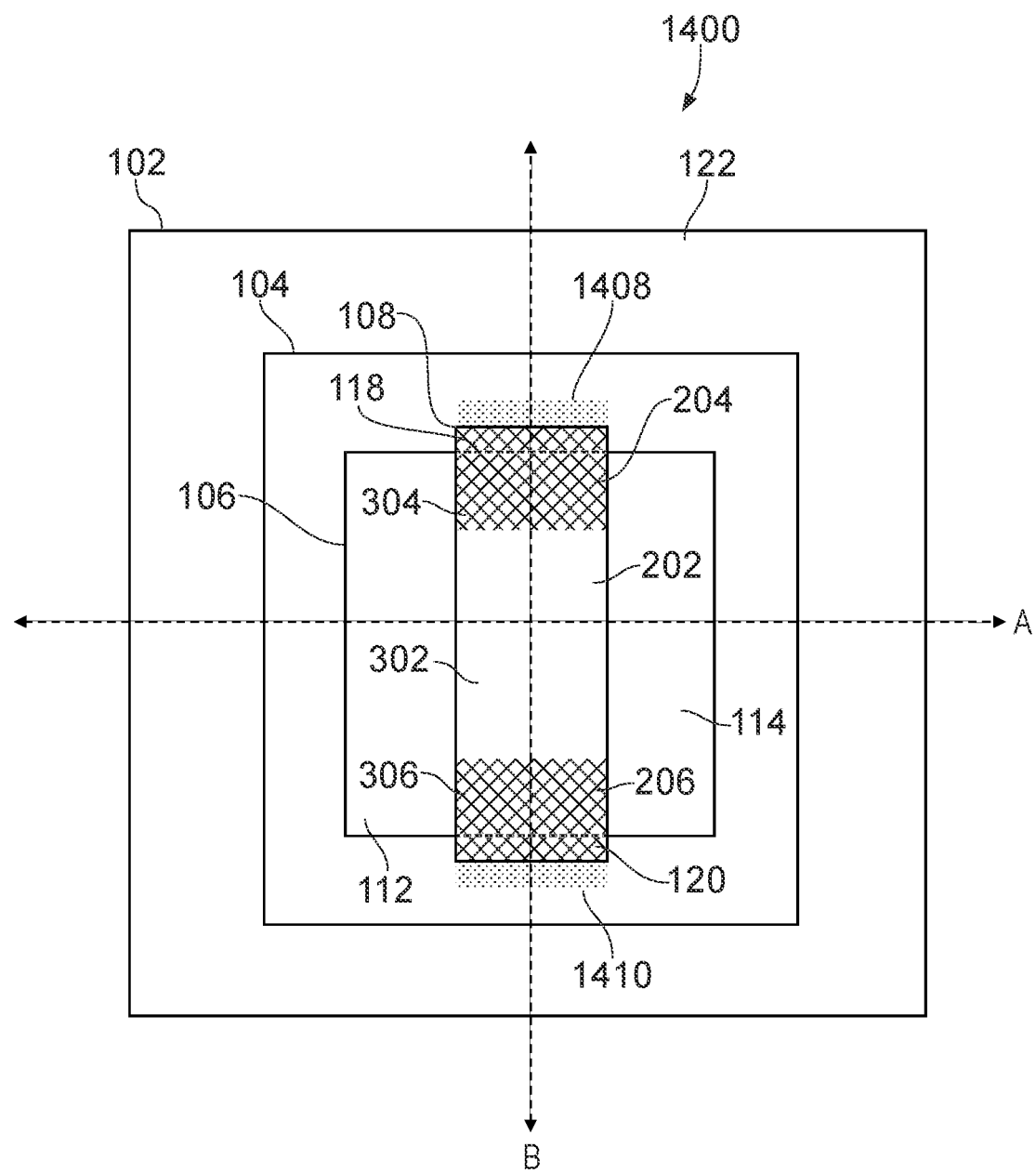
FIG. 14A shows a plan view of a field effect transistor according to another example of the present disclosure.
Figure 14B:
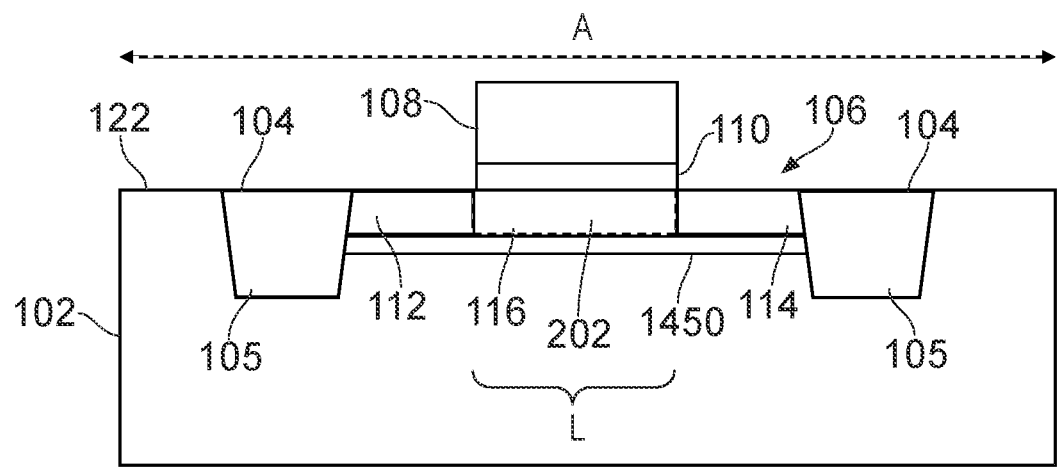
FIG. 14B shows a first cross-sectional view of the field effect transistor of FIG. 14A.
Figure 14C:
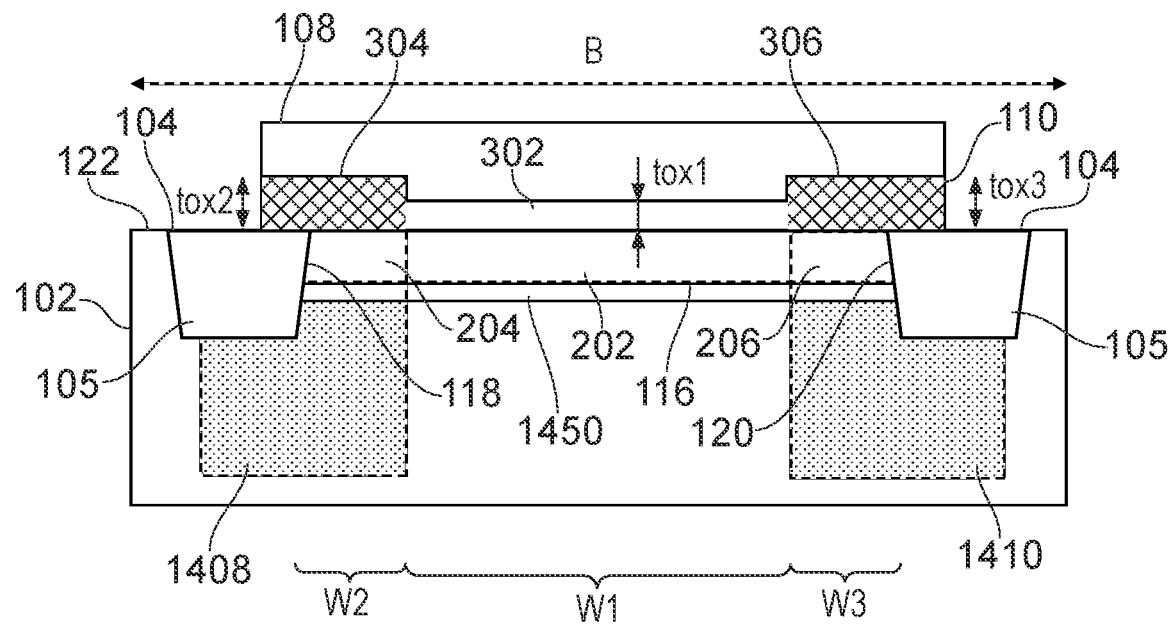
FIG. 14C shows a second cross-sectional view of the field effect transistor of FIG. 14A.

FIGS. 14A-14C show views of a field effect transistor (FET) 1400 according to another example of the present disclosure. The example of FIGS. 14A-14C illustrates another modification of the FET 400. In particular, the example of FIGS. 14A-14C show that the techniques of the present disclosure can be applied to Silicon on Insulator (SOI) FET structures, and particularly Fully Depleted Silicon on Insulator (FDSOI) FET structures.

The FET 1400 differs from the FET 400 in that the FET 1400 comprises a buried dielectric layer 1450. The buried layer 1450 is buried in the substrate 102 below the active layer 106. In particular the buried layer 1450 is provided directly below the active layer 106 such that the buried layer 1450 is directly adjacent to the bottom of the active layer 106. The length and width of the buried layer 1450 is dimensioned to separate the active layer 106 from the substrate 102 below. For example, the buried layer 1450 can have a length and width that is corresponding to or greater than the length and width of the active layer. The buried layer 1450 may be formed of any suitable dielectric. For example, the buried layer 1450 can be an oxide, such as silicon dioxide. In other examples the buried layer 1450 can be made of sapphire.

In accordance with SOI or FDSOI FET structures, the active layer 106 is provided over the buried layer 1450. As such, the active layer in the FET 1400 may be separate to the substrate 102. The source region 112 and the drain region 114 of the active layer 106 are substantially similar to the source and drain regions already described above for the FETs 200, 300 and 400. However, the channel region 116 can be formed of un-doped semiconductor material, such as an un-doped semiconductor film. As such, the FET 1400 further differs from the FET 400 in that the channel region 116 does not have p-type (or n-type) conductivity. Rather the channel region 116 may have neutral conductivity. The channel can be formed of any suitable semiconductor film, such as silicon or silicon-germanium (SiGe).

The FET 1400 comprises a first modified region 1408 and a second modified region 1410. The modified regions 1408 and 1410 are similar to the modified regions 208 and 210 of the FET 200 and 400 described above. However, the modified regions 1408 and 1410 do not contain the respective side portions 204 and 206 of the channel region 116 within their volumes as described in respect of the FET 200. Rather, the modified regions 1408 and 1410 are provided underneath the buried layer 1410 and below the respective side portions 204 and 206 of the channel region 116. However, the modified regions 1408 and 1410 still have a length and width that encompasses the length and width of the respective side portion 204 or 206. In FIG. 14C, the depth of the modified regions 1408 and 1410 are illustrated as extending below the depth or bottom of the isolation trench 105. However, in some examples, the depths of the modified regions 1408 and 1410 may have a lesser depth to the trench 105 (i.e. the depth of the isolation trench 105 may extend below the depths of the modified regions 1408 and 1410). In other examples, the modified regions 1408 and 1410 and the trench 105 reach substantially the same depth in the substrate 102.

The threshold voltage of the FET 1400 is dependent on the doping level or concentration of the substrate 102 underneath the channel region 116 and the buried layer 1450. Since the doping concentration of the substrate 102 under the channel region 116 differs across the width W of the channel region 116, the FET 1400 will therefore have different threshold voltages at different portions along the width of the channel region 116. A larger or higher doping concentration under the channel generally results in a larger threshold voltage. Therefore, the FET 1400 will have a relatively larger threshold voltage at the side portions 204 and 206 of the channel region 116 where the doping concentration of the substrate 102 under the channel region 116 is $P^{mod}$. The FET 1400 will have a relatively lower threshold voltage at the center portion 202 of the channel region 116 where the doping concentration of the substrate 102 under the channel region 116 is P−.

Consequently, when the channel region 116 is conducting a current during operation of the FET 1400, the channel region 116 will conduct a dominant (e.g., relatively larger) current between the source region 112 to the drain region 114 through the center portion 202 of the channel region 116, for a given biasing arrangement of the FET 1400 (e.g., for a given drain-source voltage and/or gate-source voltage of the FET 1400). The channel region 116 will conduct a relatively weaker current between the source region 112 to the drain region 114 through the side portions 204 and 206 of the channel region 116 for the same biasing arrangement of the FET 1400. Additionally or alternatively, the center portion 202 will have a higher current density than the side portions 204 and 206 for a given biasing arrangement of the FET 1400.

As such, the FET 1400 exhibits similar enhancements and advantages to the FET 400 described above.

In some examples, as illustrated in FIGS. 14A-14C, the FET 1400 can also have a dielectric layer 110 with an increased thickness tox2 and tox3 above the side portions 204 and 206 of the channel region 116, as already described above. However, this can be optional. As such, in some examples of the FET 1400, the FET 1400 can comprises the modified regions 1408 and 1410 but a dielectric layer with substantially uniform thickness as shown in FIG. 1. However, in other examples, the FET 1400 can have the dielectric layer 110 with increased thicknesses tox2 and tx3 above the side portions 204 and 206 of the channel region 116, without having the modified regions 1408 and 1410.

Figure 6A:
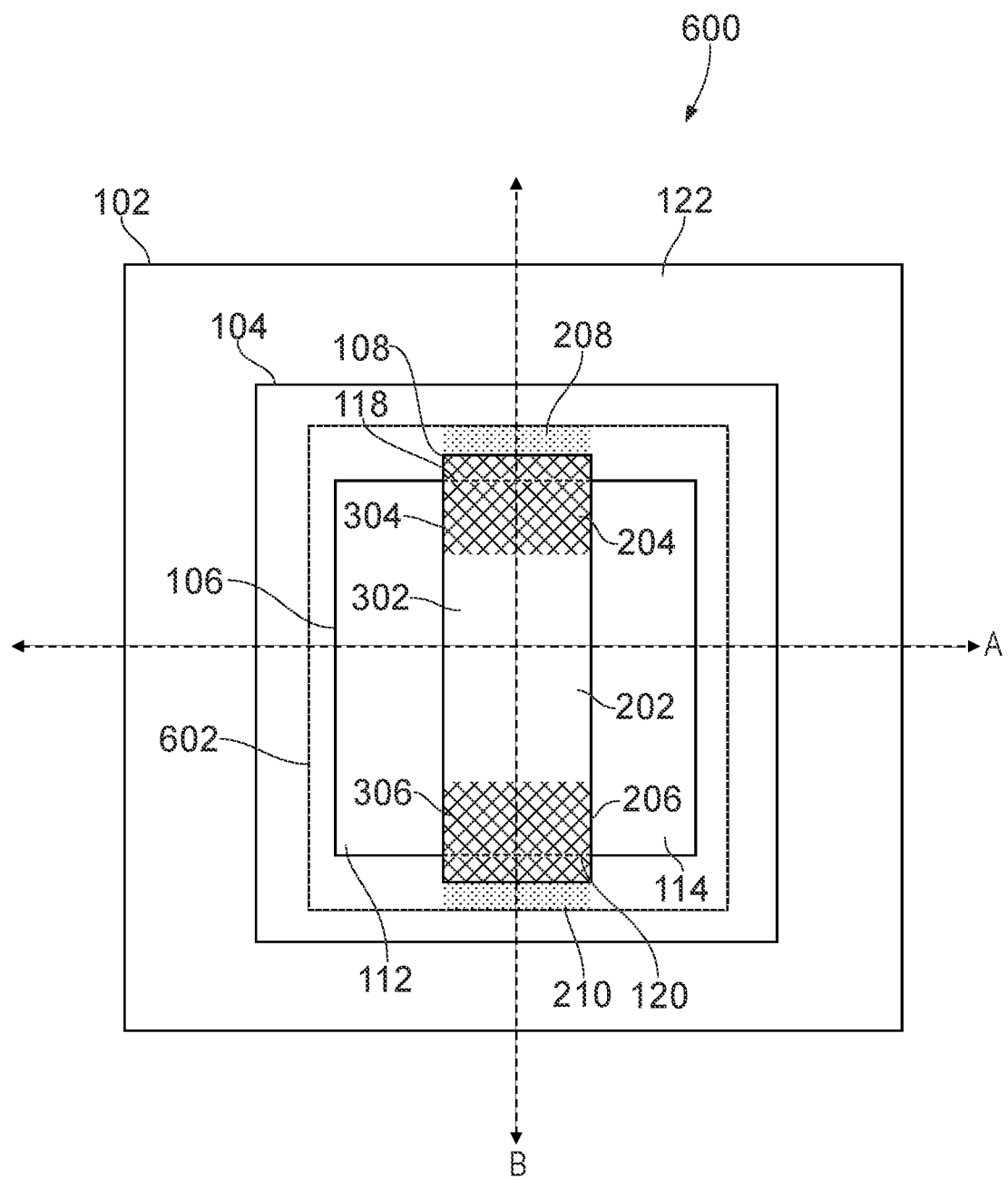
FIG. 6A shows a plan view of a field effect transistor according to another example of the present disclosure.
Figure 6B:
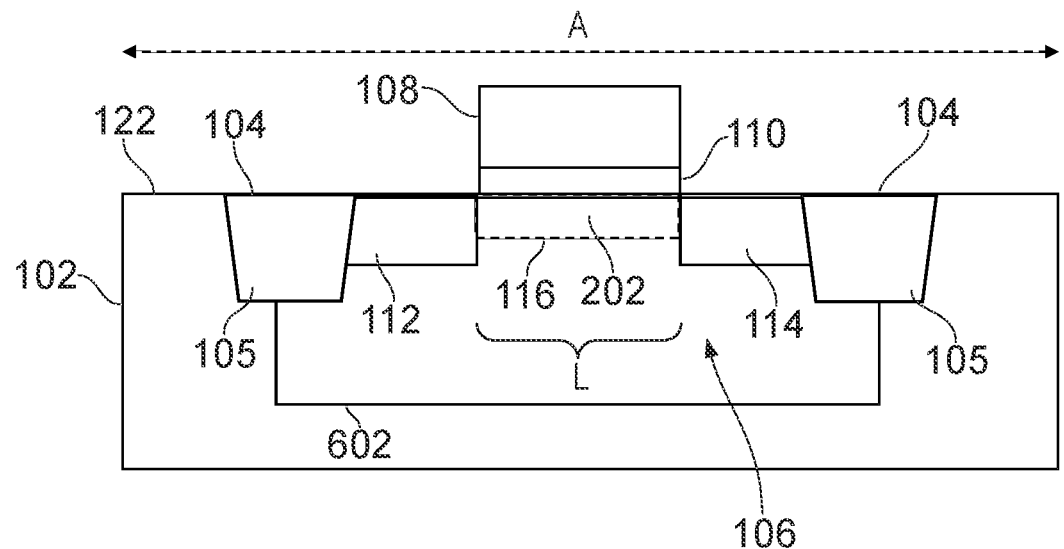
FIG. 6B shows a first cross-sectional view of the field effect transistor of FIG. 6A.
Figure 6C:
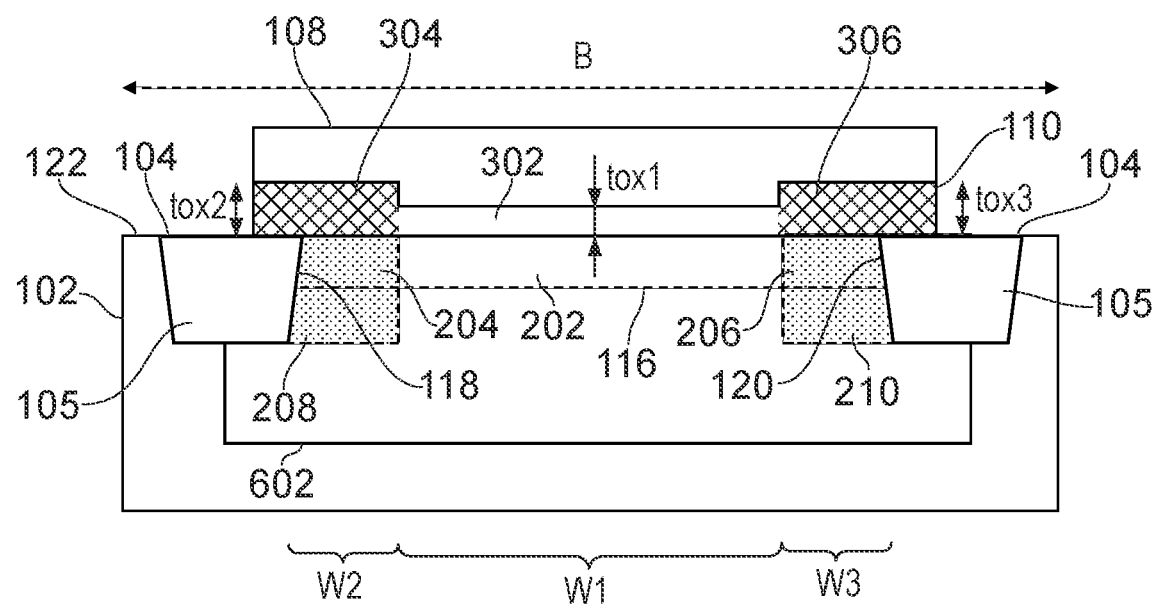
FIG. 6C shows a second cross-sectional view of the field effect transistor of FIG. 6A.

FIGS. 6A-6C show views of a field effect transistor (FET) 600 according to another example of the present disclosure. In particular, the example of FIGS. 6A-6C illustrates another modification of the FET 400.

The substrate 102 of the FET 600 further comprises a well region 602. The well region 602 comprises the active region 106. In particular, the well region 602 has a length, width and a depth that encompasses the active region 106. As illustrated, the well region 602 has a depth that is greater than the depth of the isolation trench 105 but is smaller than the entire depth of the substrate 102. The well region 602 has a width that is greater than the total width W of the channel region 116 such that the well region 602 laterally extends past the channel width edges 118 and 120. Furthermore, the well region 602 has a length that is greater than the combined length of the source region 112, drain region 114 and the channel region 116. As shown in FIG. 6C, the first and second modified regions 208 and 210 may have a depth that does not extend beyond the depth (i.e. the bottom of) the well region 602. As illustrated, the depth of the modified regions 208 and 210 may be equal to the depth of the isolation trench 105. In other examples, the depth of the modified regions 208 and 210 may be equal to the depth of the well region 602. In other examples, the depth of the modified regions 208 and 210 may be less than the depth of the well region 602. For example the depth of the modified regions 208 and 210 may be in between the depth of the trench 105 and the well region 602, or less then the depth of the trench 105.

In one example, the well region 602 has P-type conductivity. In particular, the well region has a doping concentration $P^{well}$ of P-type dopant. Since the center portion 202 of the channel region 116 is comprised in the well region 602, the center portion 202 of the channel region 116 also has the doping concentration $P^{well}$. However, the modified regions 208 and 210 have the doping concentration $P^{mod}$ as described above. The remaining P-type regions of the substrate 102 (i.e. the remainder of the substrate other than the source region 112 and the drain region 114) has the doping concentration P− as described above. The doping concentration $P^{well}$ is greater than P−, but less than $P^{mod}$. As such, the channel region 116 is formed of the center portion 202 having the doping concentration $P^{well}$, and the side portions 204 and 206 having the relatively higher doping concentration $P^{mod}$. Therefore, even in the presence of the well region 602, the channel region 116 will conduct a relatively higher current through the center portion 202 and a relatively lower current through the side portions 204 and 206 as described above.

Advantageously, the techniques of the present disclosure can be applied to FETs where it is desired to have a doping concentration (e.g., $P^{well}$) in the center of the channel region, that is different to a native doping concentration (e.g., P−) of the substrate 102. This allows the threshold voltages and conduction properties across the channel 116 to be further tuned or modified, whilst still providing a dominant current path through the center portion 202 of the channel.

In another example, the structure illustrated in FIGS. 6A-6C can be used to provide a P-type FET on a P-type substrate. In this example the substrate 102 generally has P-type conductivity with a concentration P− of a P-type dopant as described above. The well region 602 however may have N-type conductivity. In particular the well region 602, including the center portion 202 of the channel may have a doping concentration $N^{well}$ of N-type dopant. The modified regions 208 and 210 however have a doping concentration $N^{mod}$ of N-type dopant. The source 112 and the drain 114 regions have a doping concentration P+ of P-type dopant. The concentration $N^{mod}$ is greater than $N^{well}$. Moreover, the concentration P+ is greater than P−. As such, the channel region 116 is formed of the center portion 202 having the doping concentration $N^{well}$ that is lower than the doping concentration $N^{mod}$ of the side portions 204 and 206. Advantageously, this structure provides a P-type FET on a P-type substrate 102 that achieves the advantages of the N-type FETs described above.

Although the FET 600 has been described as a modification of the FET 400, it should be appreciated that any of the FETs 200, 300, 500 or 1400 may also be modified to comprise a well region 602 as is described above. In respect of the FET 1400, the well region may occupy the area of the substrate below the channel 116 and the buried layer 1450, and comprise the modified regions 1408 and 1410. For a P-type well region, the modified regions 1408 and 1410 below the sides 204 and 206 of the channel 116 may have the doping concentration $P^{mod}$ and the well region below the center 202 of the channel 116 may have the lower doping concentration $P^{well}$. Moreover, for a N-type well region, the modified regions 1408 and 1410 below the sides 204 and 206 of the channel 116 may have the doping concentration $N^{mod}$ and the well region below the center 202 of the channel 116 may have the lower doping concentration $N^{well}$, whilst the source and drain have P-type conductivity.

Figure 7:
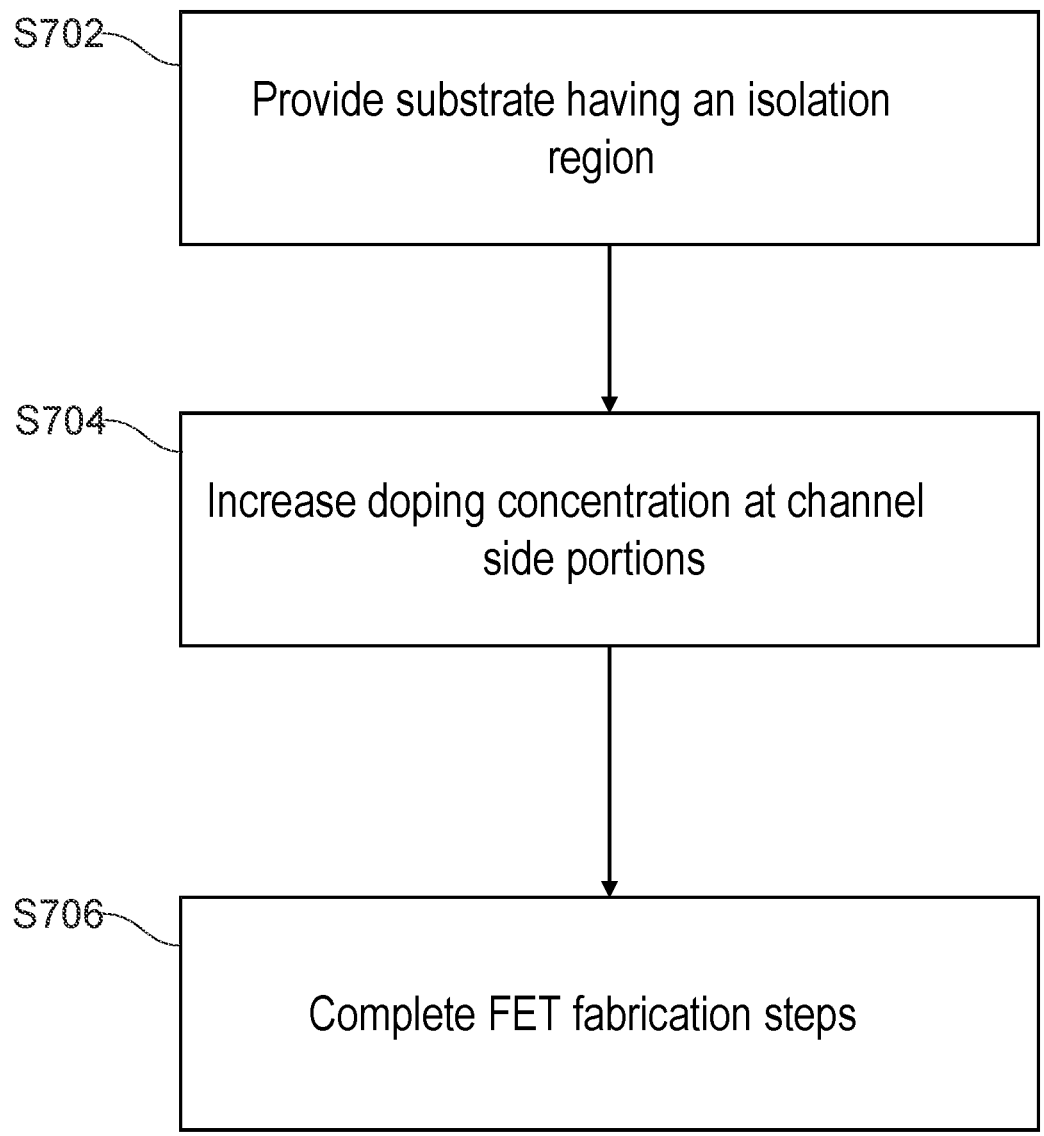
FIG. 7 is a flow diagram showing a manufacturing process of a field effect transistor according to an example of the present disclosure.
Figure 8A:
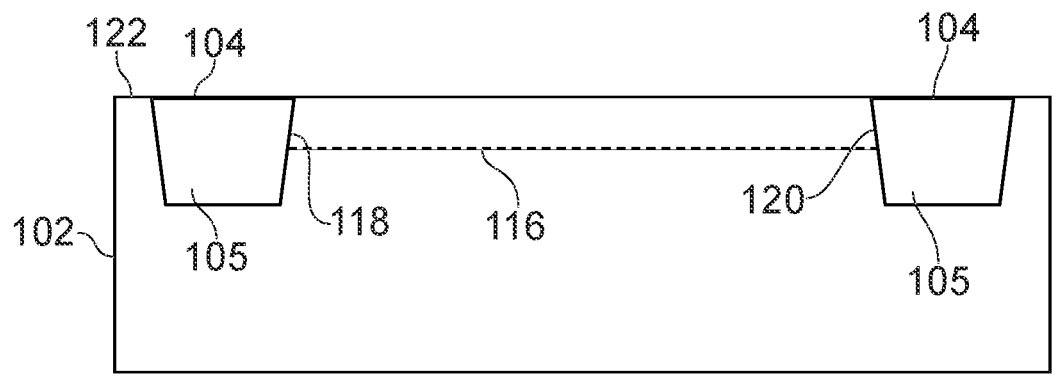
FIGS. 8A-8C are cross sectional diagrams of an example field effect transistor manufactured according to the process of FIG. 7.
Figure 8B:
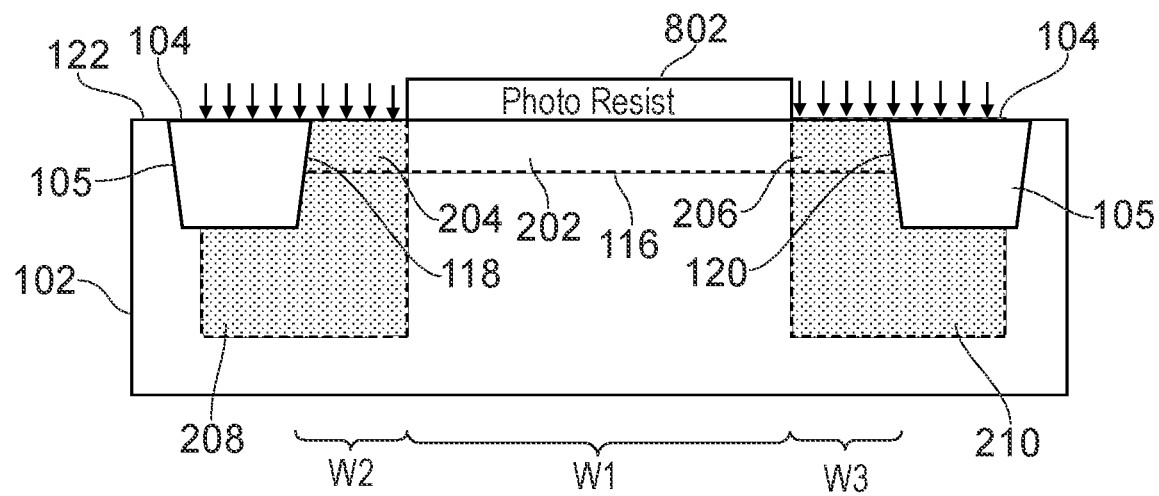
Figure 8C:
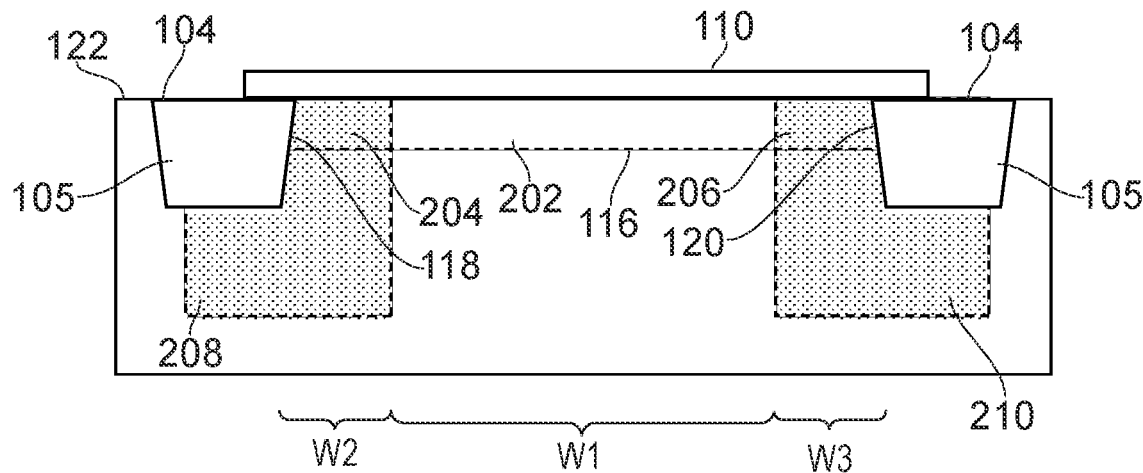

FIG. 7 shows a flow diagram illustrating a method of manufacturing the FET 200. Furthermore, FIGS. 8A-8C illustrate partially manufactured versions of the FET 200. The steps of FIG. 7 are described with reference to FIGS. 8A-8C.

Reference is made to FIG. 8A. Step S702 comprises providing the substrate 102 having the isolation region 104. As described above, the substrate 102 generally has P-type conductivity. In particular, the substrate 102 has the doping concentration P− of P-type dopant. The isolation region 104 comprises the isolation trench 105 having isolation material. The isolation region 104 also defines the border of the active region 106. The source region or the drain region may not yet be formed in the active region at this stage. However, the location of the channel region 116 may nevertheless be known or predetermined. Moreover, the locations of the center portion 202 and the side portions 204 and 206 of the channel region 116 may be known or predetermined.

In step S702, the isolation region 104 may be formed in the substrate 102 according to known techniques. For example, forming the isolation region 104 in the substrate 102 can involve etching an isolation trench in the substrate, and filling the trench with the isolation material according to known STI and/or LOCOS processes.

At step S704, the side portions 204 and 206 of the channel region 116 are modified to have a higher doping concentration $P^{mod}$ than the center portion 202 of the channel region 116.

FIG. 8B illustrates an example way of achieving step S704. As shown in FIG. 8B, a photoresistive material 802 may be deposited over the center portion 202 of the channel region 116. The surface 122 above side portions 204 and 206 of the channel region 116 is therefore left exposed. Option-ally, the photoresistive material 802 is deposited over other parts of the top surface 122 of the substrate 102, or the other parts may be otherwise masked, such that only the side portions 204 and 206 of the channel region 116 are left exposed. A P-type dopant is then implanted or diffused into the modified regions 208 and 210 which encompass the side portions 204 and 206. The photoresistive material 802 prevents the P-type dopant from being implanted or diffused into the center portion 202 of the channel region 116. Consequently, the center portion 202 still has the doping concentration P− of the substrate 102. However, the side portions 204 and 206 now have the doping concentration $P^{mod}$ that is greater than P−. The photoresistive material 802 may subsequently be removed. The side portions 204 and 206 of the channel region 116 may be otherwise formed to have the doping concentration $P^{mod}$ using any other known techniques in the art.

At step S708, the manufacturing of the FET 200 is completed according to known techniques. For example, subsequent steps may involve forming the dielectric layer 110 over the top surface 122 of the substrate as shown in FIG. 8C. Subsequent steps may also involve forming the N-type source region 112, the N-type drain region 114, extension and/or pocket regions, and the gate 108 in accordance with the FET 200.

Figure 10:
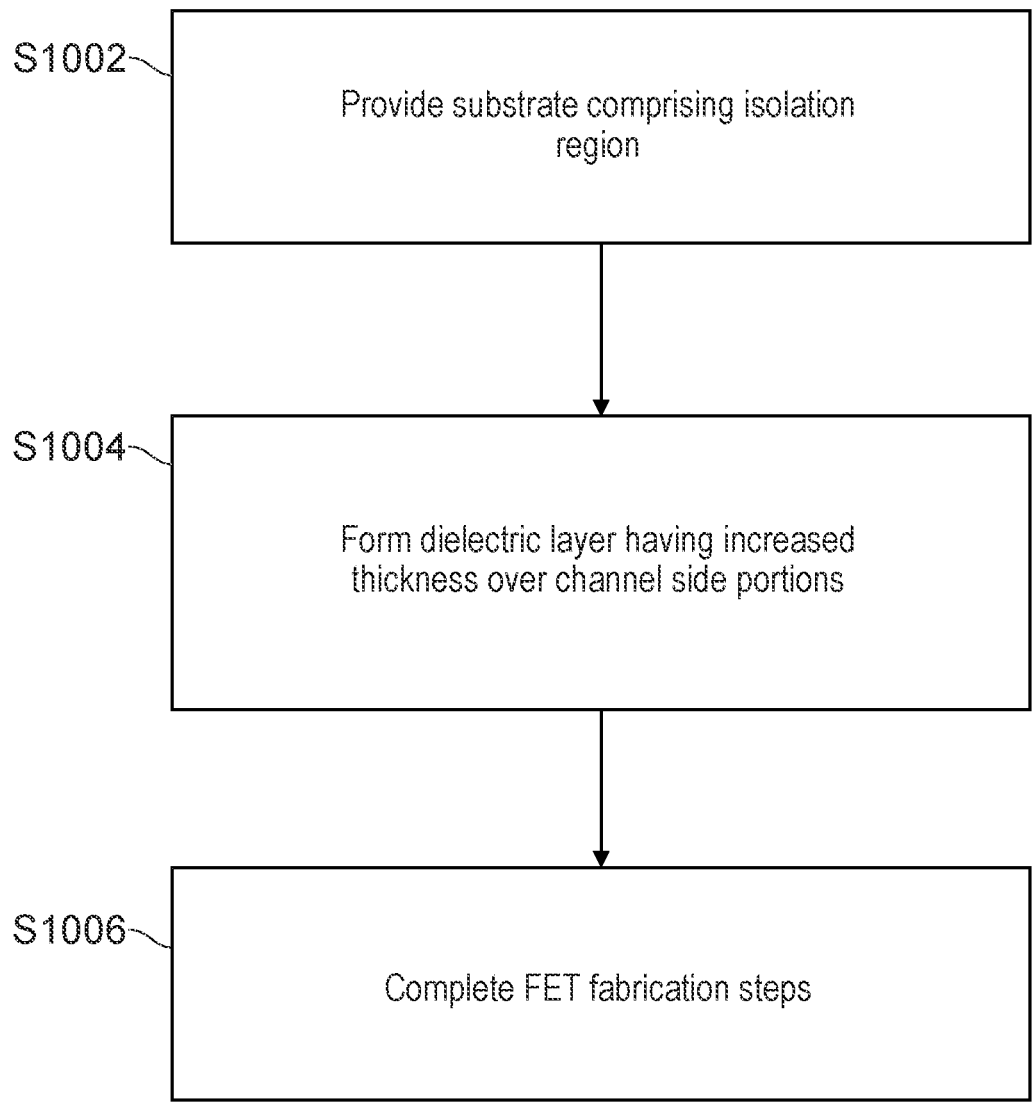
FIG. 10 is a flow diagram showing a manufacturing process of a field effect transistor according to another example of the present disclosure.

FIG. 10 shows a flow diagram illustrating a method of manufacturing the FET 300. Furthermore, FIGS. 11A-11D illustrate partially manufactured versions of the FET 300. The steps of FIG. 10 are described with reference to FIGS. 11A-11D.

At step S1002, the substrate 102 comprising the isolation region 104 is provided, similarly to step S702 of the method in FIG. 7.

At step S1004, the dielectric layer 110 is formed. In particular, the dielectric layer 110 having an increased thickness over the side portions 204 and 206 of the channel region 116 is formed on the top surface 122 of the substrate 102.

Figure 11A:
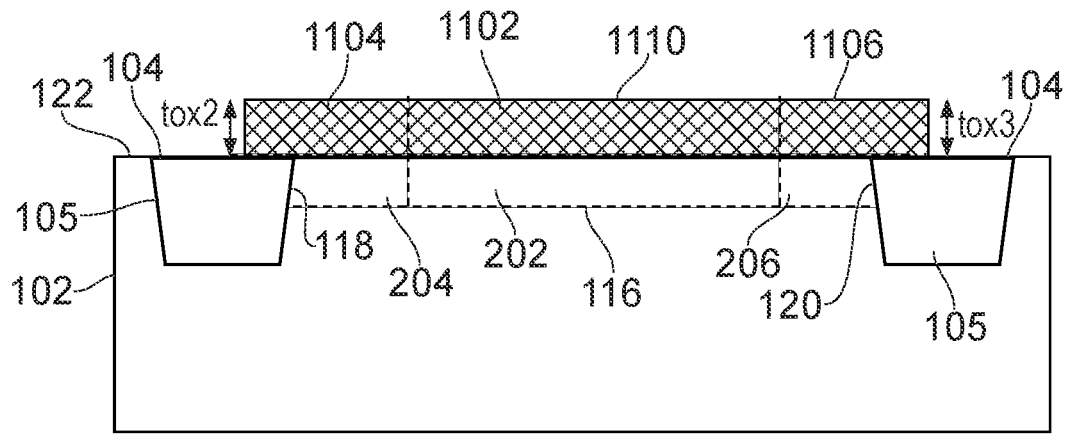
FIGS. 11A-11D are cross sectional diagrams of an example field effect transistor manufactured according to the process of FIG. 10.
Figure 11B:
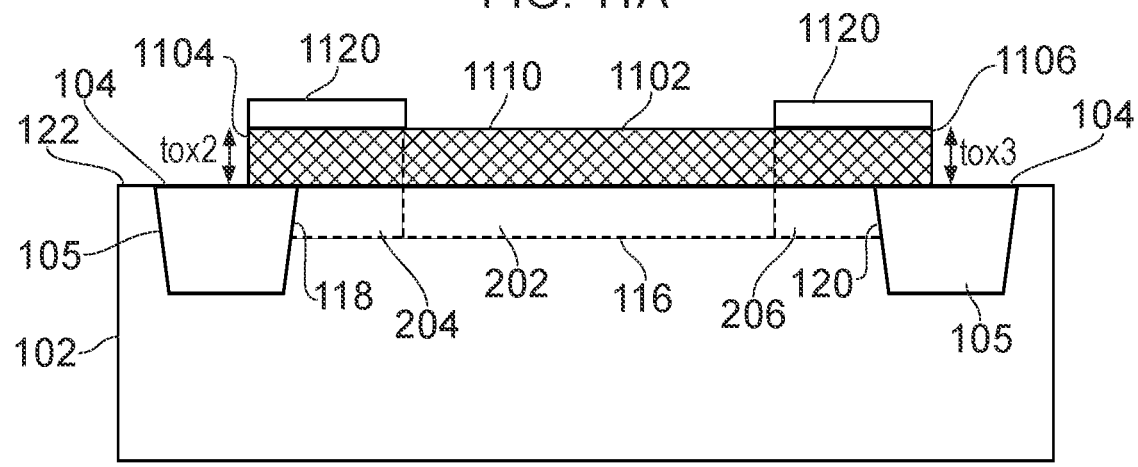

FIGS. 11A-11D illustrate an example way in which step S1004 can be achieved. With reference to FIG. 11A, an initial dielectric layer 1110 is formed over the top surface 122 of the substrate 102. The initial dielectric layer 1110 covers the width and the length of the channel region 116 whilst extending over the channel width edges 118 and 120, similarly to the dielectric layer 110 described above. In particular, the initial dielectric layer 1110 covers the center portion 202 and the side portions 204 and 206 of the channel region 116. As such, the initial dielectric layer 1110 can be viewed as having a center portion 1102 above the center portion 202 of the channel region 116, a first side portion 1104 over the first side portion 204 of the channel region 116, and a second side portion 1106 over the second side portion 206 of the channel region 116. The initial dielectric layer 1110 has a thickness tox2=tox3, which corresponds to the desired thicknesses of the side portions 304 and 306 of the dielectric layer 110. The initial dielectric layer 1110 may be formed according any known technique. For example, the initial dielectric layer 1110 can be thermally grown.

Figure 11C:
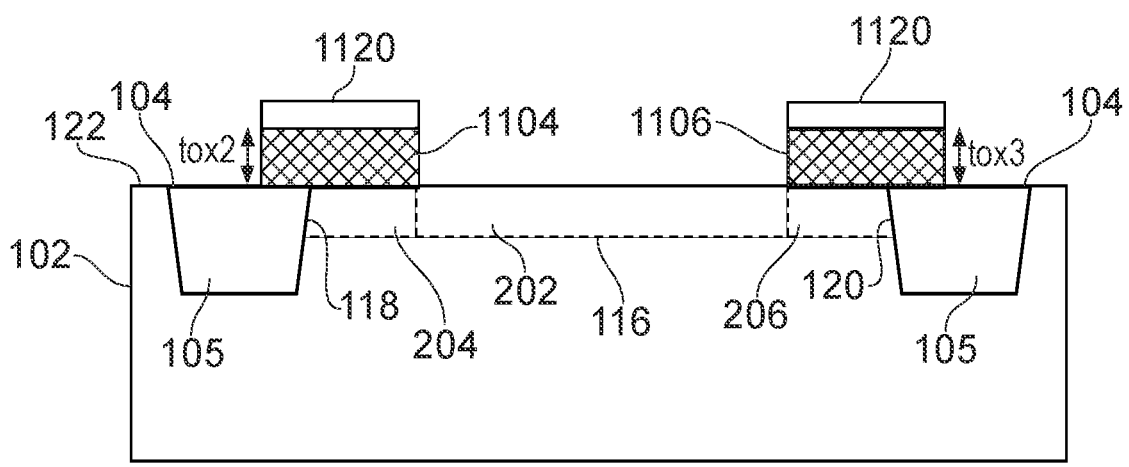

Subsequently, the center portion 1106 of the dielectric layer 1102 is etched or otherwise removed. This leaves behind the first side portion 1104 and the second side portion 1106 of the initial dielectric layer 1110, which are above the side portions 204 and 206 respectively. For example, with reference to FIG. 11B, a photoresistive material 1120 may be deposited over the first side portion 1104 and the second side portion 1106 of the initial dielectric layer 1110. The center portion 1102 of the initial dielectric layer 1110 may remain exposed. Optionally, the photoresistive material 1120 is deposited over other parts of the top surface 122 of the substrate 102, or the other parts are otherwise masked, such that only the center portion 1102 of the initial dielectric layer 1110 is left exposed. Next, as shown in FIG. 11C, the center portion 1102 of the initial dielectric layer 1110 is etched or otherwise removed, and the side portions 1104 and 1106 remain. The photoresistive material 1120 prevents the side portions 1104 and 1106 from being etched during this step. The photoresistive material 1120 may afterwards be removed. The center portion 1102 of the initial dielectric layer 1110 may be etched or removed according any other known technique.

Figure 11D:
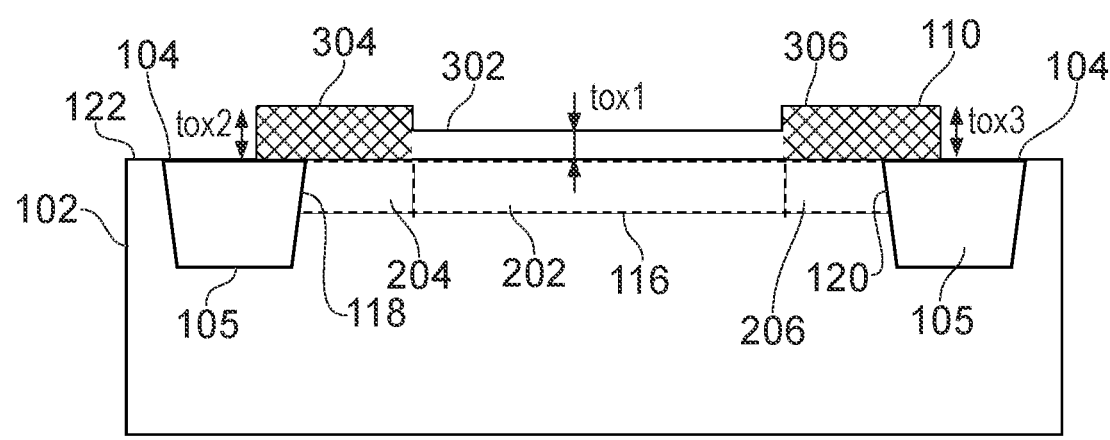

Next, as shown in FIG. 11D, dielectric material is formed in the etched region above the center portion 202 of the channel region 116 to form the completed dielectric layer 110. In particular, the dielectric material formed in FIG. 11D forms the center portion 302 of the completed dielectric layer 110, having thickness tox1. The remaining side portions 1104 and 1106 of the initial dielectric layer 1110 form the side portions 304 and 306 of the completed dielectric layer 110, having thickness tox2=tox3. The center portion 302 of the dielectric layer 110 is preferably formed of the same dielectric material as the side portions 304 and 306.

Referring back to FIG. 10, at step S1006, the manufacturing of the FET 300 is completed according to known techniques. For example, subsequent steps may involve forming the N-type source region 112, the N-type drain region 114, extension or pocket regions, and the gate 108 in accordance with the FET 300.

Figure 12:
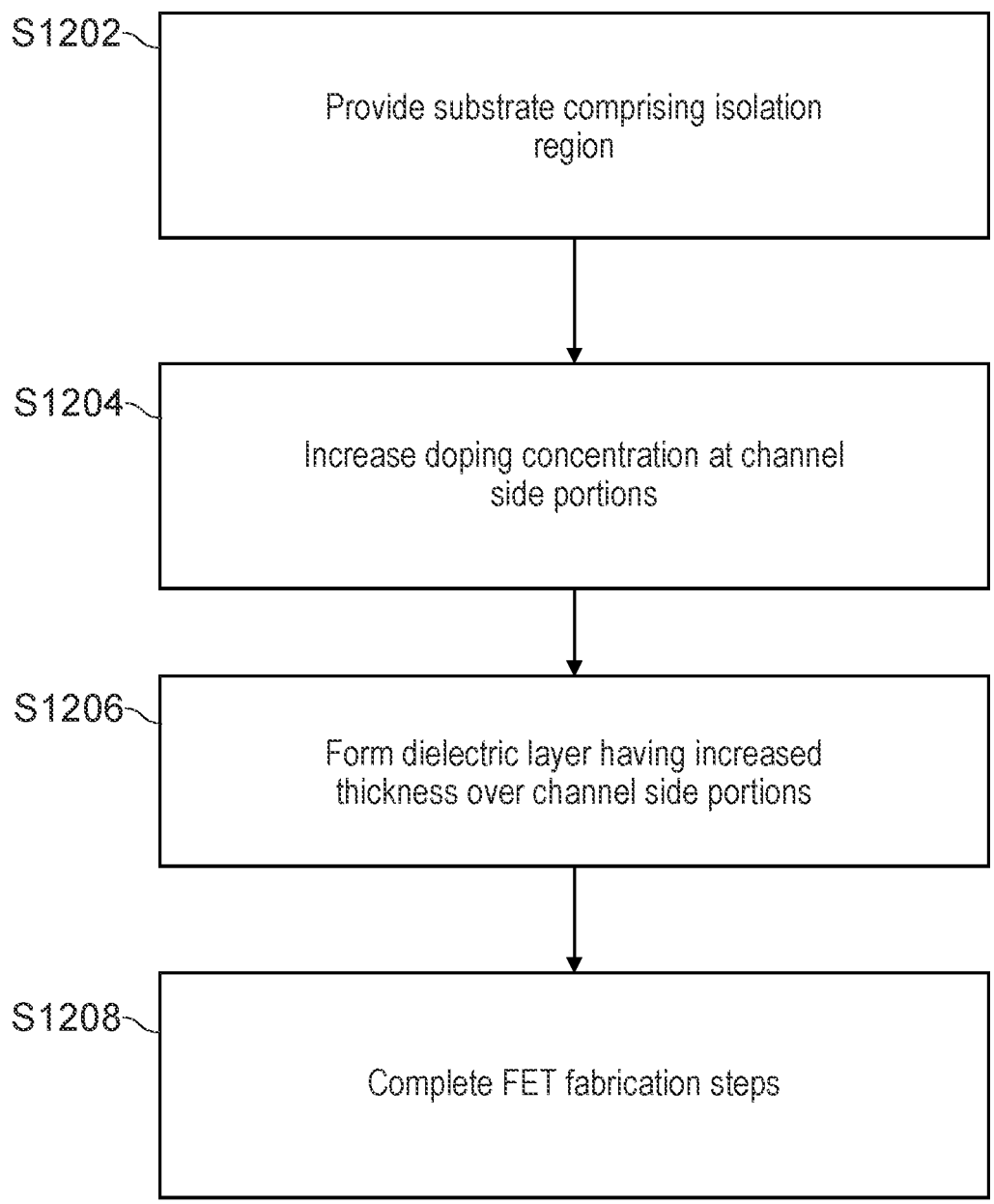
FIG. 12 is a flow diagram showing a manufacturing process of a field effect transistor according to another example of the present disclosure.

FIG. 12 shows a flow diagram illustrating a method of manufacturing the FET 400 illustrated in FIGS. 4A-4C. Furthermore, FIGS. 13A-13D illustrate partially manufactured versions of the FET 400. The steps of FIG. 12 are described with reference to FIGS. 13A-13D.

Figure 13A:
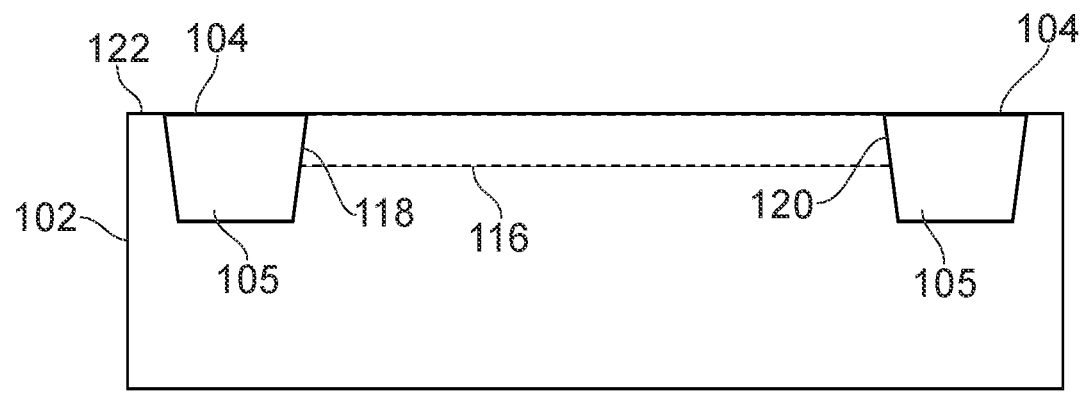
FIGS. 13A-13C are cross sectional diagrams of an example field effect transistor manufactured according to the process of FIG. 12.

Reference is made to FIG. 13A. At step S1202, the substrate 102 comprising the isolation region 104 is provided, similarly to step S702 of the method in FIG. 7 and step S1002 in FIG. 10.

Figure 13B:
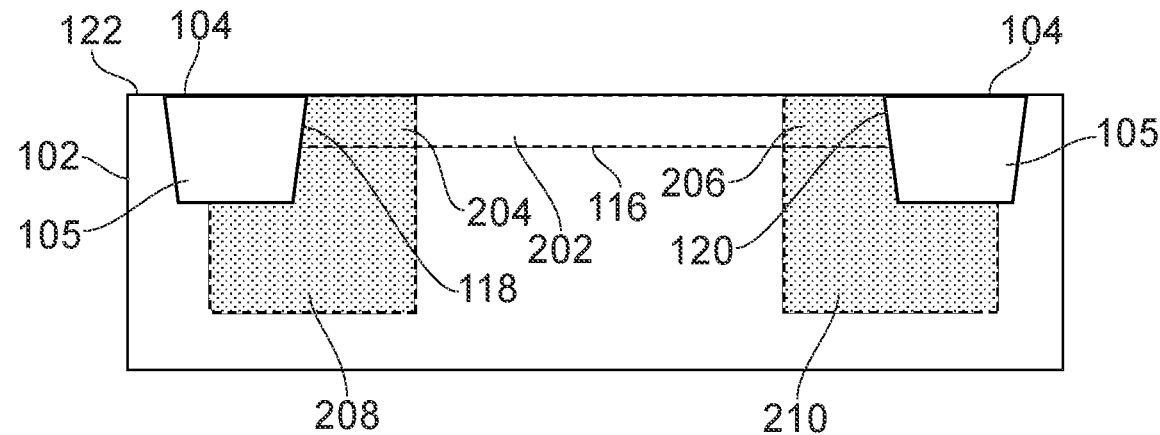

Reference is made to FIG. 13B. At step S1204, the side portions 204 and 206 of the channel region 116 are modified to have a higher doping concentration $P^{mod}$ than the center portion 202 of the channel region 116. This step can be achieved as described above in relation to step S704 in FIG. 7 and FIGS. 8A-8B.

Figure 13C:
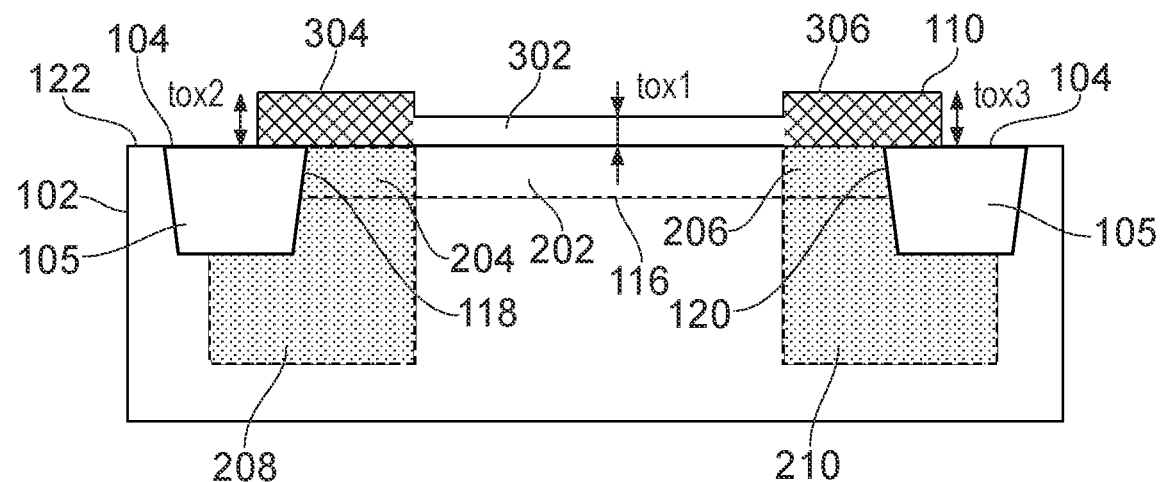

Reference is made to FIG. 13C. At step S1206 the dielectric layer 110 is formed having an increased thickness over the side portions 204 and 206 of the channel region 116. This step can be achieved in the same ways as described above in relation to step S1004 in FIG. 10 and FIGS. 11A-11D.

At step S1208, the manufacturing of the FET 400 is completed according to known techniques. For example, subsequent steps may involve forming the N-type source region 112, the N-type drain region 114, extension and/or pocket regions, and the gate 108 in accordance with the FET 400.

It will be appreciated that the method of FIG. 12 can be modified to manufacture the examples described in relation to the FET 1400 of FIGS. 14A-14C. For example, in step S1202, the substrate 102 can be additionally provided with the buried layer 1450 according to known SOI and/or FDSOI fabrication techniques. For example, this may involve providing a starting structure comprising the substrate 102 and the buried layer 1450, forming an epitaxial channel region over the buried layer 1450 and then forming the isolation region 104 according to known techniques. At step S1204, the modified regions 1408 and 1410 may be formed in a similar way to the formation of the modified regions 208 and 210 described above. Optionally, the dielectric layer 110 may then be formed as described above in accordance with step S1206. Otherwise, a dielectric layer with uniform thickness across the channel is formed. The fabrication of the FET 1400 is then completed in step S1208 according to known techniques.

Figure 9A:
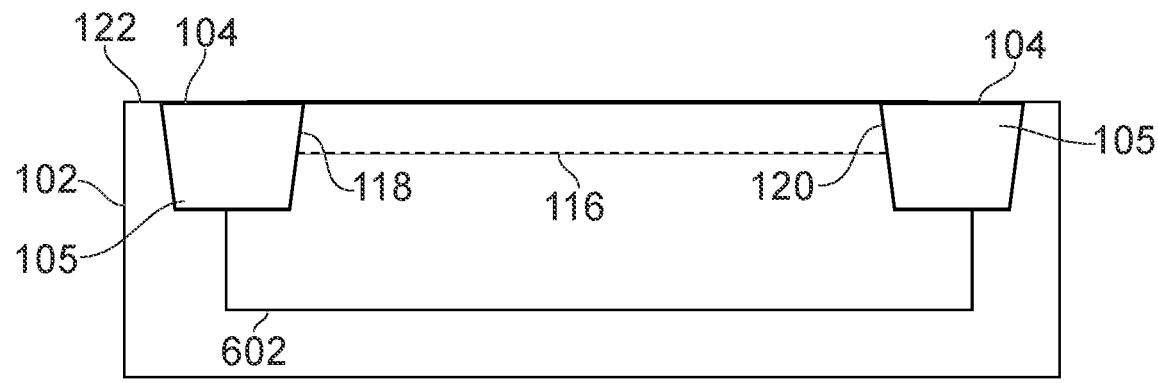
FIGS. 9A-9C are cross sectional diagrams of another example field effect transistor manufactured according to some examples of the present disclosure.
Figure 9B:
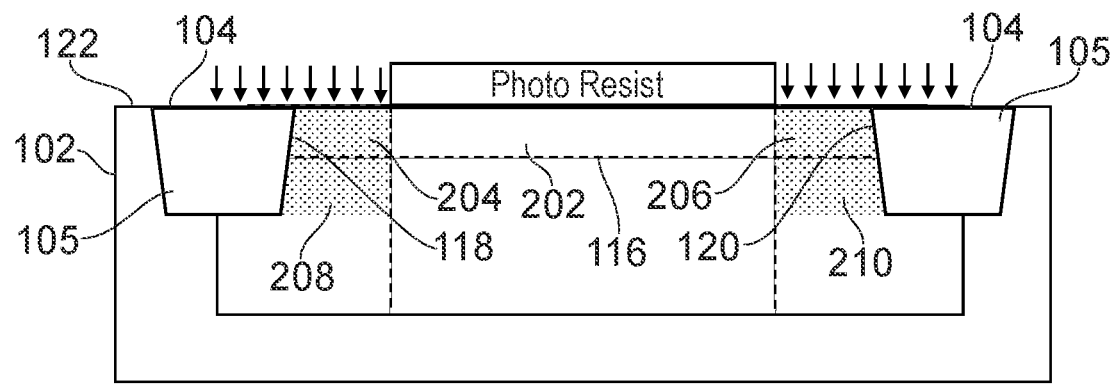
Figure 9C:
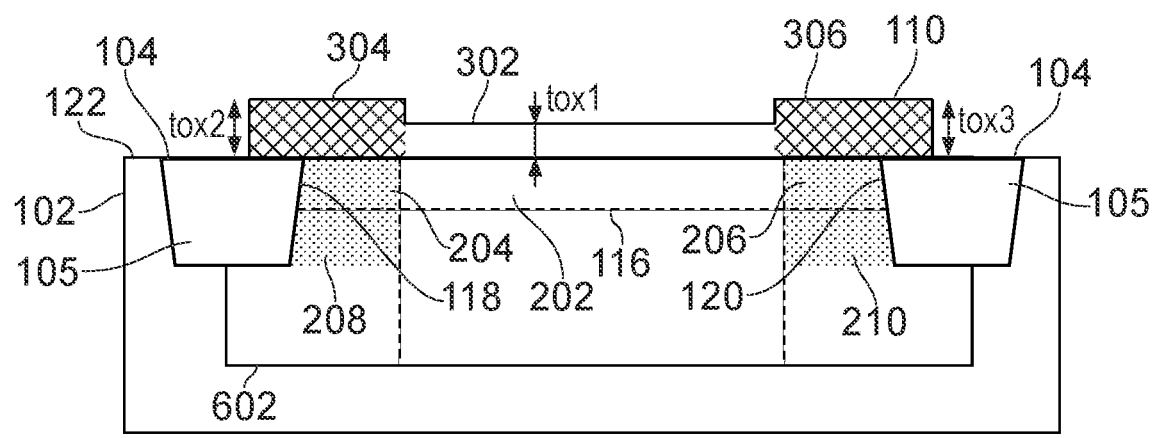

It will also be appreciated that the method of FIG. 12 can be modified to manufacture the examples described in relation to the FET 600. Reference is made to FIGS. 9A-9C. In step S1202, the substrate 102 can be additionally provided with the well region 602 formed therein as shown in FIG. 9A using known techniques. As discussed above, the well region 602 can be P-type with a doping concentration $P^{well}$. In this case, in step S1204 and as shown in FIG. 9B, the modified regions 208 and 210 are formed to have the doping concentration $P^{mod}$ as described above, such that $P^{mod} > P^{well}$. The method may then proceed to step S1206 as described above and shown in FIG. 9C, before proceeding to step 1208.

In another example, the well region 602 can be N-type with a doping concentration $N^{well}$. In this case, in step S1204, the modified regions 208 and 210 are formed to have the doping concentration $N^{mod}$ using techniques corresponding to those described above, such that $N^{mod} > N^{well}$. For example, the doping concentration $N^{mod}$ can be provided using a similar technique to that illustrated and described in relation to FIG. 8B, but using a N-type dopant instead of a P-type dopant. The method may then proceed to step S1206 as described above. In step S1208, the manufacturing of the FET 600 is completed according to known techniques. In this example, subsequent steps may involve forming a P-type source region 112, a P-type drain region 114, extension and/or pocket regions, and the gate 108.

As discussed above, any of the FETs 200, 300 or 1400 may also comprise a well region. As such, in manufacturing an example of the FET 200 with a well region 602, the step S1206 may be skipped or omitted. Rather, a regular dielectric layer 110 as shown in FIGS. 1A-1C and 2A-2C may be fabricated instead. Furthermore, in manufacturing an example of the FET 300 with a well region, the step S1204 may instead be skipped or omitted. In manufacturing an example of the FET 1400 with a well region, the step S1202 may further comprise providing the buried layer as described above, in addition to a well region. For example, the well region may be formed in between the steps of forming the channel region and the isolation region.

The above described structures and methods are example ways in which the techniques of the present disclosure can be applied to FET structures. It will be appreciated that the disclosed techniques may be applied to other similar FET structures. For example, the above techniques can be applied to dual-gate FET structures.

In the above description, example values and parameters have been given for the structuring and dimensions of the above described FETs. However, it will be appreciated that the exact dimensions of the above described FET structures and the materials used may vary depending on design rules of the FET fabrication process(es) being used. As such, different dimensions are envisaged depending on the circumstances of the implementation.

As described above, parts or regions of the FETs can have either P-type conductivity or N-type conductivity. It will be appreciated that regions of P-type conductivity can comprise any one or more P-type dopants which contribute to the P-type dopant concentration of that region. Furthermore, regions of N-type conductivity can comprise any one or more N-type dopants that contribute to the N-type dopant concentration of that region. As one example, the substrates and/or well regions described above can comprise a first p-type dopant at the above described concentrations P− and $P^{well}$. The modified regions 208/210 or 1408/1410 can also have the first p-type dopant at the respective concentrations $P^{mod}$. In such examples, step S704 of the method in FIG. 7 can involve introducing more of the first p-type dopant to the modified regions 208 and 210 to increase the p-type concentration of those regions to $P^{mod}$. Alternatively, the modified regions 208/210 or 1408/1410 can comprise a combination of the first p-type dopant and a second p-type dopant different to the first p-type dopant at concentrations which total to the doping concentration $P^{mod}$. In such example, step S704 of the method in FIG. 7 can involve introducing a second p-type dopant to the modified regions 208 and 210 to increase the p-type concentration of those regions to $P^{mod}$. However, it will be appreciated that the modified regions 208 and 210 can comprise any number of different p-type dopants such that the total p-type doping concentration in those regions is increased to $P^{mod}$. The p-type dopant(s) used can be any suitable p-type dopant, such as Boron and/or Indium. The N-type dopant(s) used in N-type regions can be any suitable N-type dopant, such as Phosphorous and/or Arsenic.

In the above description, the modified regions 208/210 and 1408/1410 have been described as having the same doping concentration $P^{mod}$. However, in some examples, the first modified region 208 may have a different doping concentration $P^{mod1}$ in comparison to a doping concentration $P^{mod2}$ of the second modified region 210. Each doping concentration $P^{mod1}$ and $P^{mod2}$ may individually satisfy target doping concentration $P^{mod}$ described above such that the FET still achieves reduced current paths through the channel near the channel width edges, and thus the advantages of the present disclosure. The modified regions 1408 and 1410 may also have different doping concentrations $P^{mod1}$ and $P^{mod2}$ as described above.

In the above description, the side portions 304 and 306 of the dielectric layer 110 have been described as having the same thickness tox2=tox3. However, in some examples, the first side portion 304 may have a different thickness tox2 to the thickness tox3 of the second side portion 306. However, each thickness tox2 and tox3 may individually satisfy the target dielectric thicknesses described above such that the FET still achieves reduced current paths through the channel near the channel width edges, and thus the advantages of the present disclosure.

In the above description and figures, the channel region 116 has been described and illustrated as having two side portions 204 and 206 with the center portion 202 distanced from both channel edges 118 and 120. The techniques herein enable a dominant current path through the center portion 202 and a reduced current path near the channel edges 118 and 120. However, it will be appreciated that for some FET structures, it will be sufficient to apply the techniques of the disclosure to only one side of the channel, i.e. to provide a reduced current path only at one of the channel edges 118 or 120. For example, it can be sufficient that only one of the regions 208 or 210 of the channel 116 have an increased doping concentration $P^{mod}$ only one of the regions 1408 or 1410 below the channel 116 have an increased doping concentration $P^{mod}$ or only one of the regions 304 or 306 of the dielectric layer 110 have an increased thickness as described above.

In the above description, the FETs 200, 400, 500, 600 have been described such that the side portions 204 and 206 of the channel 116 are made to have a higher P-type doping concentration than the center 202 of the channel 116. Consequently the channel center 202 is more conductive (and has a lower threshold voltage) than the channel sides 204 and 206, which are less conductive with a higher threshold voltage. However, it will be appreciated that the channel center 202 can be made more conductive than the sides 204 and 206 using alternative techniques. In particular, in some examples, the FETs 200, 400, 500, 600 may not have the modified regions 208 and 210. The FETs may instead be configured such that the center 202 of the channel 116 has a doping concentration $N^{chan}$ of N-type dopant. The side portions 204 and 206 may have a lower concentration or substantially no concentration of N-type dopant. Accordingly, the center 202 of the channel 116 will have a lower threshold voltage than the sides 204 and 206 of the channel 116. Thus, a dominant current path will be provided through the center 202 of the channel, and the FET will exhibit the benefits and advantages as described above. It will be appreciated that the FET 1400 may be similarly modified, such that the region of the substrate 102 under the center 202 of the channel 116 has a higher N-type doping concentration than the regions of the substrate 102 under the sides 204 and 206 of the channel 116. Furthermore, it will be appreciated that the methods of FIGS. 7, and 12 may be correspondingly adapted to manufacture such FETs. For example, in steps S704 and S1204, the method may involve implanting or diffusing a N-type dopant into a region of the substrate 102 comprising the center 202 of the channel 116 but not the sides 204 and 206 of the channel 116. Regarding the FET 1400, such step may involve implanting or diffusing a N-type dopant into a region of the substrate 102 below the center 202 of the channel 116 but not below the sides 204 and 206 of the channel 116. In some examples, the above FETs can have both an increased concentration of P-type dopant in the side portions 204 and 206 of the channel 116 in comparison to the center 202, and an increased concentration of N-type dopant in the center 202 in comparison to the side portions 204 and 206.

In the above description, the FETs 200, 300, 400, 500, 600 and 1400 have been described primarily as (N-type) enhancement mode FETs. It will be appreciated that the techniques of the present disclosure may also be applied to (N-type) depletion mode FETs. In a depletion mode implementation, the whole channel 116 may have N-type conductivity with a doping concentration $N^{chan}$ of N-type dopant. This provides a naturally conductive channel 116 between the source 112 and drain 114 regions according to depletion mode structures. The current paths through the side portions 204 and 206 can be reduced by reducing the conductivity at those parts of the channel 116. For example, by introducing more P-type dopant to the modified regions 208 and 210, the conductivity of the side portions 204 and 206 are reduced in comparison to the center 202 of the channel 116. Alternatively or additionally, by introducing more N-type dopant to the center portion 202 of the channel 116, the conductivity of the center 202 is higher in comparison to the sides 204 and 206 of the channel 116.

In the above description, the FETs 200, 300, 400, 500, 600 and 1400 and most variations thereof have been primarily described as N-type FETs. It will be appreciated that complementary FET types, e.g., P-type FETs, can be provided in a similar way using complementary semiconductor material types and/or dopant types. Moreover, in one example, the structure of the FET 600 can be used to provide a P-type FET on a N-type substrate using complementary semiconductor material types and dopant types. It will also be appreciated that the structure of the FET 600 can also be used to provide a N-type FET on a N-type substrate by using complementary semiconductor material types and dopant types.

It should be appreciated that the FET structures described above may have gate, drain, source and body contact terminals for electrically coupling the corresponding regions of the FET to external components or circuitry. However, the contact terminals have been omitted from the figures and the above discussion for simplicity.

In the above description, it is described that some aspects of the FET structures may have "same", "substantially the same", "uniform", "substantially uniform" or otherwise corresponding properties (e.g., material, dimensions, or thickness) to other aspects of the FET structure. However, it will be appreciated that whilst some aspects of the FET structure are designed to have the same properties (e.g., material or thickness), there may be variations in practice owing to manufacturing limitations.

What is claimed is:

1. A field effect transistor (FET) comprising:
   a substrate comprising a first region and a second region that are adjacent to each other in a channel width direction and doped with a dopant or dopants of the same conductivity type at different doping concentrations;
   an active region comprising a source region, a drain region and a channel region between the source region and the drain region in a channel length direction orthogonal to the channel width direction;
   a first dielectric layer provided over the channel region;
   a gate provided at least partly over the first dielectric layer; and
   an isolation region adjacent to an edge of the channel region and extending lengthwise in the channel length direction,
   wherein the channel region comprises a first portion distanced from the edge of the channel region in the channel width direction and a second portion in between the first portion and the edge of the channel region in the channel width direction and substantially co-extensive with the channel region in the channel length direction,
   wherein the second region of the substrate comprises the second portion of the channel region and vertically extends from a surface of the second portion of the channel region and into the substrate and partly around a bottom of the isolation region, and
   wherein the FET is configured such that a dominant current path is defined between the source region and the drain region through the first portion of the channel region.

2. The FET of claim 1, wherein the first region of the substrate and the second region of the substrate are located such that the dominant current path is defined through the first portion of the channel region.

3. The FET of claim 2, wherein the first region of the substrate comprises the first portion of the channel region.

4. The FET of claim 2, wherein the first region of the substrate is located at least below the first portion of the channel region, and wherein the second region of the substrate is located at least below the second portion of the channel region.

5. The FET of claim 4, further comprising a second dielectric layer between the active region and the substrate, wherein the first region of the substrate and the second region of the substrate are located below the second dielectric layer.

6. The FET of claim 1, wherein the first portion of the channel region and the second portion of the channel region are formed of substantially the same semiconductor material.

7. The FET of claim 1, wherein a portion of the gate over the first portion of the channel region and a portion of the gate over the second portion of the channel region are formed of substantially the same material and/or have substantially the same doping concentration.

8. The FET of claim 1, wherein the isolation region is a shallow trench isolation (STI).

9. The FET of claim 1, wherein the central region of the channel region and the substrate are doped with a same dopant at a same concentration.

10. The FET of claim 1, wherein the central region of the channel region and the substrate have a same native dopant concentration.

11. A field effect transistor (FET) comprising:
    a substrate comprising a first region and a second region that are adjacent to each other in a channel width direction and doped with a dopant or dopants of the same conductivity type at different doping concentrations;
    an active region comprising a source region, a drain region and a channel region between the source region and the drain region in a channel length direction orthogonal to the channel width direction;
    a first dielectric layer provided over the channel region;
    a gate provided at least partly over the first dielectric layer; and
    an isolation region adjacent to an edge of the channel region and extending lengthwise in the channel length direction,
    wherein the channel region comprises a first portion distanced from the edge of the channel region in the channel width direction and a second portion in between the first portion and the edge of the channel region in the channel width direction and substantially co-extensive with the channel region in the channel length direction,
    wherein the first portion and the second portion are doped with a dopant or dopants of the same conductivity type at different doping concentrations,
    wherein the first dielectric layer comprises a first portion over the first portion of the channel region and a second portion over the second portion of the channel region, wherein the first portion of the dielectric layer has a greater thickness than the second portion of the dielectric layer, and
    wherein the FET is configured such that a dominant current path is defined between the source region and the drain region through the first portion of the channel region.

12. The FET of claim 11, wherein the first portion of the first dielectric layer and the second portion of the first dielectric layer are formed of substantially the same dielectric material.

13. A method of manufacturing a field effect transistor (FET), the method comprising:
    providing a substrate comprising an isolation region;
    forming in the substrate a first region and a second region that are adjacent to each other in a channel width direction and doped with a dopant or dopants of the same conductivity type at different doping concentrations;

forming an active region comprising a source region, a drain region, and a channel region in between the source region and the drain region in a channel length direction orthogonal to the channel width direction;

forming a first dielectric layer over the channel region; and forming a gate over the dielectric layer, wherein the channel region comprises an edge adjacent to the isolation region extending lengthwise in the channel length direction, a first portion distanced from the edge in the channel width direction, and a second portion between the first portion and the edge in the channel width direction and substantially co-extensive with the channel region in the channel length direction, and wherein the second region of the substrate comprises the second portion of the channel region and vertically extends from a surface of the second portion of the channel region and below and partly around a bottom of the isolation region, such that a dominant current path is provided through the first portion of the channel region when the FET conducts a current.

14. The method of claim 13, wherein the first region of the substrate comprises the first portion of the channel region, and the second region of the substrate comprises the second portion of the channel region.

15. The method of claim 13, wherein the first region of the substrate is located below the first portion of the channel region, and wherein the second region of the substrate is located below the second portion of the channel region.

16. The method of claim 15, wherein the active region is formed over a second dielectric layer provided in the substrate.

17. The method of claim 13, wherein the first region of the substrate and the second region of the substrate have substantially the same semiconductor material.

18. The method of claim 13, wherein the first dielectric layer is formed to have a first portion over the first portion of the channel region and a second portion over the second portion of the channel region, and wherein the second portion of the dielectric layer has a greater thickness than the first portion of the dielectric layer.

19. The method of claim 18, wherein the first portion of the first dielectric layer and the second portion of the first dielectric layer are formed of substantially the same dielectric material.

20. The method of claim 13, wherein the gate is formed such that a portion of the gate over the first portion of the channel region and a portion of the gate over the second portion of the channel region are formed of substantially the same material and/or have substantially the same doping concentration.

21. A field effect transistor (FET) comprising:

a substrate comprising a first region and a second region that are adjacent to each other in a channel width direction and doped with a dopant or dopants of the same conductivity type at different doping concentrations;

an active region having a source, a drain, and a channel region between the source and the drain, wherein the channel region comprises an edge portion extending in a direction parallel to a current path between the source and the drain in a channel length direction orthogonal to the channel width direction;

a dielectric layer over the channel region; and a gate over the dielectric layer, wherein the second region of the substrate comprises a portion of the channel region disposed laterally between a central region of the channel region and an isolation region in the channel width direction and substantially co-extensive with the channel region in the channel length direction, the second region vertically extending from a surface of the portion of the channel region and into the substrate and partly around a bottom of the isolation region, and wherein at least the substrate and the channel region are configured to reduce current flow proximal to the edge of the channel.

* * * * *